(12) United States Patent
Lee et al.

(10) Patent No.: US 11,462,604 B2
(45) Date of Patent: Oct. 4, 2022

(54) DISPLAY DEVICE

(71) Applicant: LG Display Co., Ltd., Seoul (KR)

(72) Inventors: Seongku Lee, Seoul (KR); Binn Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 273 days.

(21) Appl. No.: 16/913,190

(22) Filed: Jun. 26, 2020

(65) Prior Publication Data
US 2021/0098551 A1 Apr. 1, 2021

(30) Foreign Application Priority Data

Oct. 1, 2019 (KR) .......................... 10-2019-0121638

(51) Int. Cl.
H01L 27/32 (2006.01)
G02F 1/03 (2006.01)
(52) U.S. Cl.
CPC ........ H01L 27/3276 (2013.01); G02F 1/0316 (2013.01); H01L 2251/568 (2013.01)
(58) Field of Classification Search
CPC ........... H01L 27/3276; H01L 2251/568; G02F 1/0316
See application file for complete search history.

(56) References Cited

U.S. PATENT DOCUMENTS

2019/0019444 A1* 1/2019 Jo ..................... H01L 51/5221

FOREIGN PATENT DOCUMENTS

| KR | 10-2013-0066752 A | 6/2013 |
| KR | 10-2016-0037502 A | 4/2016 |
| KR | 10-2017-0002730 A | 1/2017 |
| KR | 10-2017-0054665 A | 5/2017 |
| KR | 10-2020-0029226 A | 3/2020 |

* cited by examiner

Primary Examiner — Anne M Hines
(74) Attorney, Agent, or Firm — Polsinelli PC

(57) ABSTRACT

A display device includes a first electrode of a first sub pixel of a first pixel, a first electrode of a second sub pixel of the first pixel, a first electrode of a first sub pixel of a second pixel, and a first electrode of a second sub pixel of the second pixel sequentially disposed along a first direction; a 1-1 welding electrode connected to the first electrode of the first sub pixel of the first pixel, a 1-2 welding electrode connected to the first electrode of the second sub pixel of the first pixel, a 2-1 welding electrode connected to the first electrode of the first sub pixel of the second pixel, and a 2-2 welding electrode connected to the first electrode of the second sub pixel of the second pixel; and a first vertical repair line overlapping the 1-1 welding electrode and the 2-1 welding electrode and a second vertical repair line overlapping the 1-2 welding electrode and the 2-2 welding electrode, wherein the first vertical repair line and the second vertical repair line include a transparent conductive material.

20 Claims, 13 Drawing Sheets

DISPLAY DEVICE

CROSS-REFERENCE TO RELATED APPLICATION

This application claims the priority of Korean Patent Application No. 10-2019-0121638 filed on Oct. 1, 2019, which is hereby incorporated by reference in its entirety.

BACKGROUND

Field of the Disclosure

The present disclosure relates to a repairable transparent display device.

Description of the Background

Various display devices which are capable of reducing a weight and a volume considered as disadvantages of the cathode ray tube are being developed. Such display devices may be implemented as a liquid crystal display (LCD), a field emission display (FED), a plasma display panel (PDP), an organic light emitting display device (OLED), and the like.

Among these flat panel display devices, an organic light emitting display device is a self-emitting display device which excites an organic compound to emit light. The organic light emitting display device which does not require a backlight used in the LCD has advantages in that it can be manufactured to be light and thin and the process can be simplified. Further, the organic light emitting display device can be fabricated at low temperature, has high-speed response speed of 1 ms or less, and shows characteristics such as low power consumption, a wide viewing angle, and a high contrast so that the organic light emitting display device is widely used.

The organic light emitting display device includes an organic light emitting diode which converts electric energy into light energy. The organic light emitting diode includes an anode, a cathode, and an organic light emitting layer disposed therebetween. Holes and electrons injected from the anode and the cathode are coupled in the light emitting layer to form excitons and the formed excitons drop from an excited state to a ground state to emit light so that the organic light emitting diode display device displays images.

Recently, a transparent display device is actively being studied. The transparent display device refers to a display device which allows a user to recognize not only visual information implemented on a front surface of a display panel, but also objects located on a rear surface of the display panel. To this end, the transparent display device includes an emission area in which driving elements are disposed to implement an input image and a transmission area in which external light is transmitted.

In the transparent display device, it is necessary to sufficiently ensure an area occupied by the transmission area to allow the user to more clearly and visibly recognize background information located on the rear surface of the display panel. It is further necessary to sufficiently ensure an area occupied by the emission area to ensure a required aperture ratio. Therefore, in order to satisfactorily perform the functions of the transparent display device, the emission area and the transmission area need to be appropriately allocated in a limited space.

In the meantime, the display device includes a repair structure to repair a defective sub pixel, thereby improving a yield. In this case, a repair area for forming the repair structure needs to be separately allocated. However, in the transparent display device, as described above, it is difficult to allocate a separate area other than the emission area and the transmission area, so that it is difficult to simply introduce a repair structure in a limited space.

SUMMARY

Accordingly, the present disclosure is to provide a transparent display device which includes a repair structure for repairing a defective sub pixel.

According to an aspect of the present disclosure, there is provided a display device. The display device includes a first electrode of a first sub pixel of a first pixel, a first electrode of a second sub pixel of the first pixel, a first electrode of a first sub pixel of a second pixel, and a first electrode of a second sub pixel of the second pixel sequentially disposed along a first direction. The display device further includes a 1-1 welding electrode connected to the first electrode of the first sub pixel of the first pixel, a 1-2 welding electrode connected to the first electrode of the second sub pixel of the first pixel, a 2-1 welding electrode connected to the first electrode of the first sub pixel of the second pixel, and a 2-2 welding electrode connected to the first electrode of the second sub pixel of the second pixel. The display device further includes a first vertical repair line overlapping the 1-1 welding electrode and the 2-1 welding electrode and a second vertical repair line overlapping the 1-2 welding electrode and the 2-2 welding electrode. The first vertical repair line and the second vertical repair line include a transparent conductive material.

According to another aspect of the present disclosure, there is provided a display device. The display device includes a first pixel and a fifth pixel symmetrical to each other with respect to an imaginary axis extending in a first direction and disposed to be adjacent to each other in a second direction intersecting the first direction. The display device further includes a welding electrode and a repair line for repair between the first pixel and the fifth pixel. The first pixel includes a first electrode of a first sub pixel of the first pixel and a first electrode of a second sub pixel of the first pixel disposed to be adjacent to the first electrode of the first sub pixel of the first pixel in the first direction. The fifth pixel includes a first electrode of a first sub pixel of the fifth pixel disposed to be adjacent to the first electrode of the first sub pixel of the first pixel along the second direction and a first electrode of a second sub pixel of the fifth pixel disposed to be adjacent to the first electrode of the first sub pixel of the fifth pixel in the first direction and adjacent to the first electrode of the second sub pixel of the first pixel in the second direction. The welding electrode includes a 1-1 welding electrode connected to the first electrode of the first sub pixel of the first pixel, a 1-2 welding electrode connected to the first electrode of the second sub pixel of the first pixel, a 5-1 welding electrode connected to the first electrode of the first sub pixel of the fifth pixel, and a 5-2 welding electrode connected to the first electrode of the second sub pixel of the fifth pixel. The repair line includes a first horizontal repair line overlapping the 1-1 welding electrode and the 5-1 welding electrode and a second horizontal repair line overlapping the 1-2 welding electrode and the 5-2 welding electrode. At least a part of the first horizontal repair line and at least a part of the second horizontal repair line includes a transparent conductive material.

According to the present disclosure, the display device includes a repair structure to repair a defective sub pixel so that a product yield may be improved.

Further, according to the present disclosure, a repair line for repair is formed of a transparent conductive material so that the corresponding area may be allocated to a transmission area. Therefore, a sufficient aperture ratio and transmittance may be ensured while equipping a repair structure so that a transparent display device with a good quality may be provided.

Therefore, according to the present disclosure, a plurality of pixels disposed in different directions can be selectively repaired so that a ratio of improving the defective sub pixel may be effectively improved.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
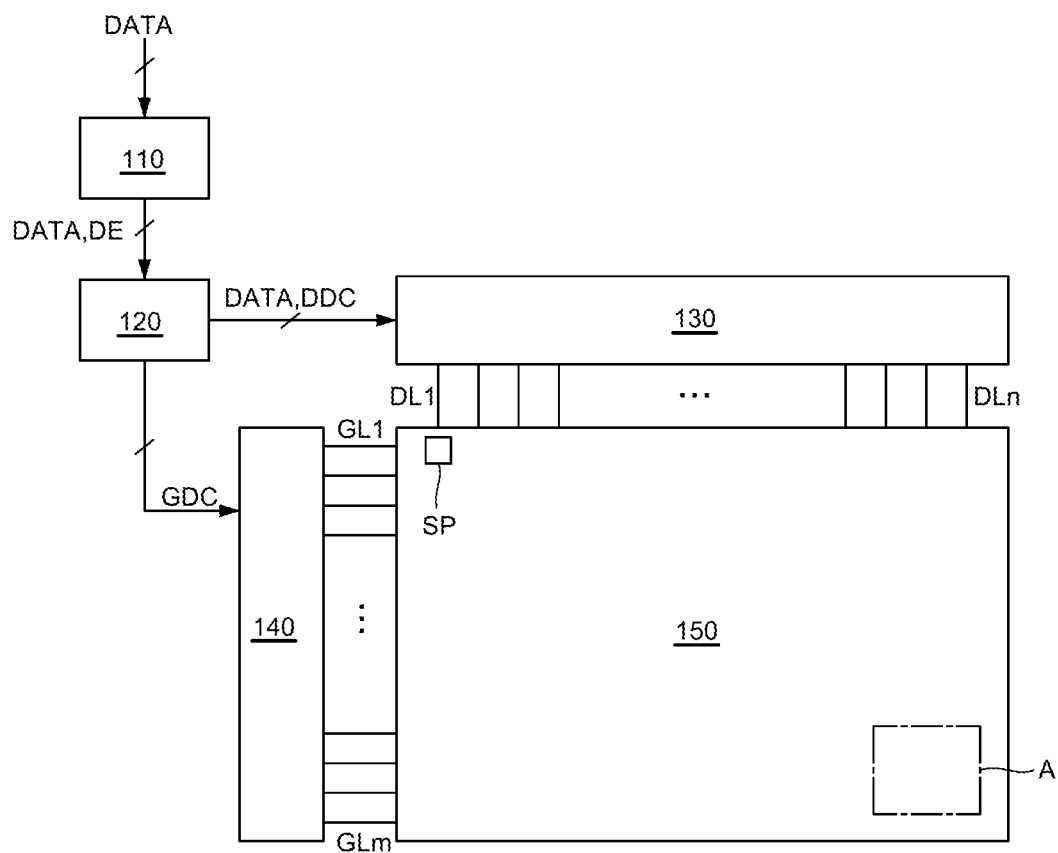
FIG. 1 is a schematic block diagram of an organic light emitting display device.

Hereinafter, exemplary aspects of the present disclosure will be described with reference to the accompanying drawings. Like reference numerals refer to like elements throughout. In the following description, when the detailed description of the relevant known function or configuration is determined to unnecessarily obscure the important point of the present disclosure, the detailed description is not provided. In the description of exemplary aspects, the same components will be representatively described in the beginning and will not be described in the other exemplary aspects.

Terms including an ordinary number, such as first and second, are used for describing various constituent elements, but the constituent elements are not limited by the terms. The above terms are used only to discriminate one component from the other component.

The display device according to the present disclosure is a display device in which a display element is formed on a substrate. The display device may be implemented as an organic light emitting display device, a liquid crystal display device, an electrophoretic display device, or the like, and hereinafter, for the convenience of description, the organic light emitting display device will be described as an example.

Figure 2:
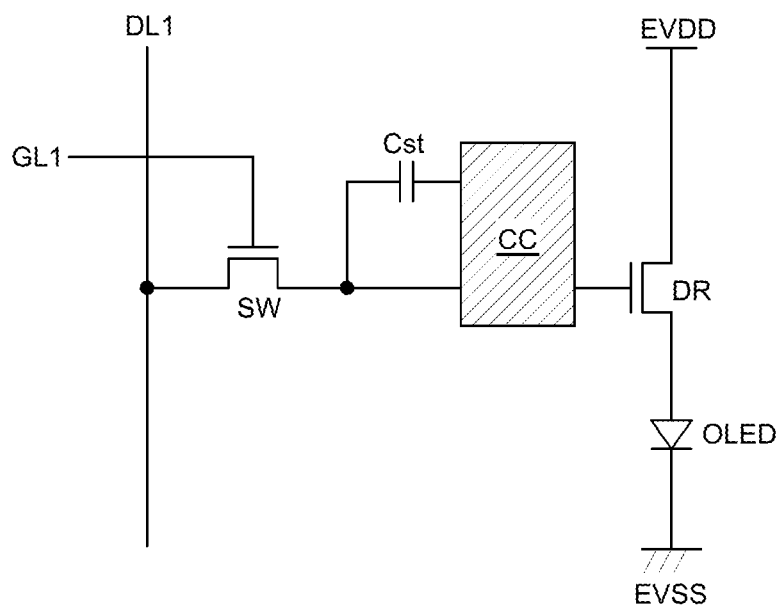
FIG. 2 is a schematic circuit diagram of a sub pixel.
Figure 3:
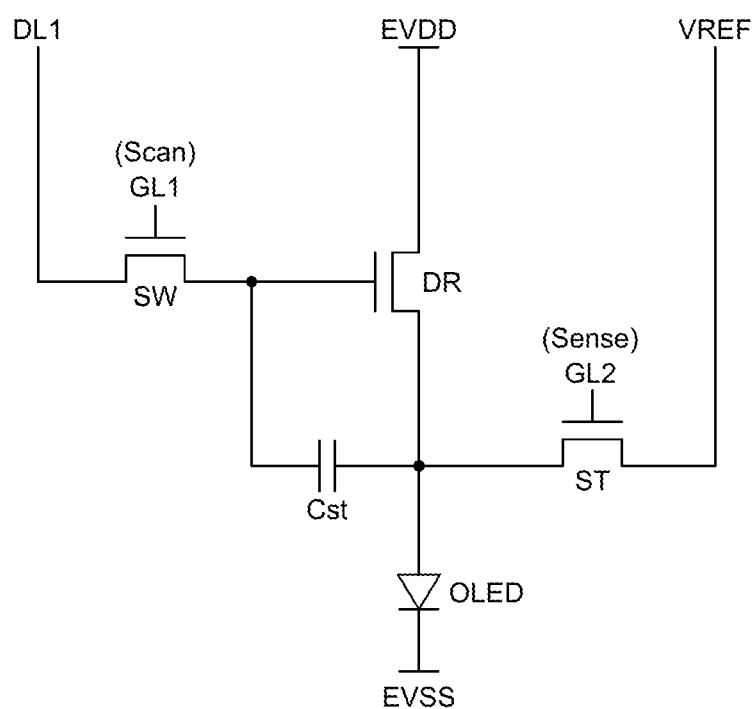
FIG. 3 is a detailed circuit diagram of a sub pixel.

FIG. 1 is a schematic block diagram of an organic light emitting display device. FIG. 2 is a schematic circuit diagram of a sub pixel. FIG. 3 is a detailed circuit diagram of a sub pixel.

As illustrated in FIG. 1, the organic light emitting display device includes an image processor 110, a timing controller 120, a data driver 130, a scan driver 140, and a display panel 150.

The image processor 110 outputs a data enable signal DE together with a data signal DATA supplied from the outside. The image processor 110 may output one or more of a vertical synchronization signal, a horizontal synchronization signal, and a clock signal, in addition to the data enable signal DE and description of the signals will be omitted for the sake of convenience.

The timing controller 120 is supplied with the data signal DATA together with a driving signal including the data enable signal DE or the vertical synchronization signal, the horizontal synchronization signal, and the clock signal from the image processor 110. The timing controller 120 outputs a gate timing control signal GDC for controlling an operation timing of the scan driver 140 and a data timing control signal DDC for controlling an operation timing of the data driver 130, based on the driving signal.

The data driver 130 samples and latches the data signal DATA supplied from the timing controller 120 in response to the data timing control signal DDC supplied from the timing controller 120 to convert the data signal into a gamma reference voltage and output the converted gamma reference voltage. The data driver 130 outputs the data signal DATA through data lines DL1 to DLn. The data driver 130 may be formed as an integrated circuit (IC).

The scan driver 140 outputs the scan signal in response to the gate timing control signal GDC supplied from the timing controller 120. The scan driver 140 outputs the scan signal through gate lines GL1 to GLm. The scan driver 140 may be formed as an integrated circuit (IC) or formed in the display panel 150 in a gate in panel manner.

The display panel 150 displays images in response to the data signal DATA and the scan signal supplied from the data driver 130 and the scan driver 140. The display panel 150 includes sub pixels SP which operates to display images.

As illustrated in FIG. 2, in one sub pixel, a switching transistor SW, a driving transistor DR, a capacitor Cst, a compensation circuit CC, and an organic light emitting diode OLED are included.

The switching transistor SW performs a switching operation such that the data signal supplied through the data line DL is stored in the capacitor Cst as a data voltage in response to the scan signal supplied through the first gate line GL1. The driving transistor DR operates to flow a driving current between a power line EVDD (a high potential voltage) and a cathode power line EVSS (a low potential voltage) in accordance with the data voltage stored in the capacitor Cst.

The organic light emitting diode OLED operates to emit light in accordance with the driving current formed by the driving transistor DR.

The compensation circuit CC is a circuit added in the sub pixel to compensate for a threshold voltage of the driving transistor DR. The compensation circuit CC is configured by one or more transistors. The compensation circuit CC has various configurations in accordance with an external compensation method so that examples thereof will be described as follows.

As illustrated in FIG. 3, the compensation circuit CC includes a sensing transistor ST and a sensing line VREF (or a reference line). The sensing transistor ST is connected between a source electrode of the driving transistor DR and an anode electrode of the organic light emitting diode OLED (hereinafter, referred to as a sensing node). The sensing transistor ST may operate so as to supply an initialization voltage (or a sensing voltage) transmitted through the sensing line VREF to the sensing node of the driving transistor DR or sense a voltage or a current of the sensing node or the sensing line VREF of the driving transistor DR.

A drain electrode of the switching transistor SW is connected to the first data line DL1 and a source electrode thereof is connected to a gate electrode of the driving transistor DR. A drain electrode of the driving transistor DR is connected to the power line EVDD and the source electrode thereof is connected to the anode electrode of the organic light emitting diode OLED. A first capacitor electrode of the capacitor Cst is connected to the gate electrode of the driving transistor DR and a second capacitor electrode is connected to the anode electrode of the organic light emitting diode OLED. The anode electrode of the organic light emitting diode OLED is connected to the source electrode of the driving transistor DR and the cathode electrode thereof is connected to a second power line EVSS. A drain electrode of the sensing transistor ST is connected to the sensing line VREF and a source electrode thereof is connected to the anode electrode of the organic light emitting diode OLED and the source electrode of the driving transistor DR which are sensing nodes. It has been described above that the transistor is implemented as an n-type transistor, but it is not limited thereto.

An operation time of the sensing transistor ST may be similar to/same as the switching transistor SW or may be different from the switching transistor SW in accordance with an external compensation algorithm (or a configuration of the compensation circuit). For example, the gate electrode of the switching transistor SW is connected to the first gate line GL1 and the gate electrode of the sensing transistor ST may be connected to the second gate line GL2. In this case, the scan signal Scan is transmitted to the first gate line GL1 and the sensing signal Sense is transmitted to the second gate line GL2. As another example, the first gate line GL1 connected to the gate electrode of the switching transistor SW and the second gate line GL2 connected to the gate electrode of the sensing transistor ST may be connected to be commonly shared.

The sensing line VREF may be connected to the data driver. In this case, the data driver may sense the sensing node of the sub pixel and generate a sensing result in real time during a non-display period of the image, or an N frame period (N is 1 or larger integer). In the meantime, the switching transistor SW and the sensing transistor ST may be turned on at the same timing. In this case, the sensing operation through the sensing line VREF and the data output operation which outputs the data signal may be separated (distinguished) from each other based on a time division method of the data driver.

In addition, an object to be compensated according to a sensing result may be a digital type data signal, an analog type data signal, or a gamma signal. Further, the compensation circuit which generates a compensation signal (or a compensation voltage) based on the sensing result may be implemented inside the data driver, inside the timing controller, or by a separate circuit.

In FIG. 3, a sub pixel having a 3T (transistor) 1C (capacitor) structure including the switching transistor SW, the driving transistor DR, the capacitor Cst, the organic light emitting diode OLED, and the sensing transistor ST has been described as an example. However, when the compensation circuit CC is added, the sub pixel may be configured by 3T2C, 4T2C, 5T1C, and 6T2C. Hereinafter, for the convenience of description, an example that the sub pixel has a 3T1C structure will be described.

Figure 4:
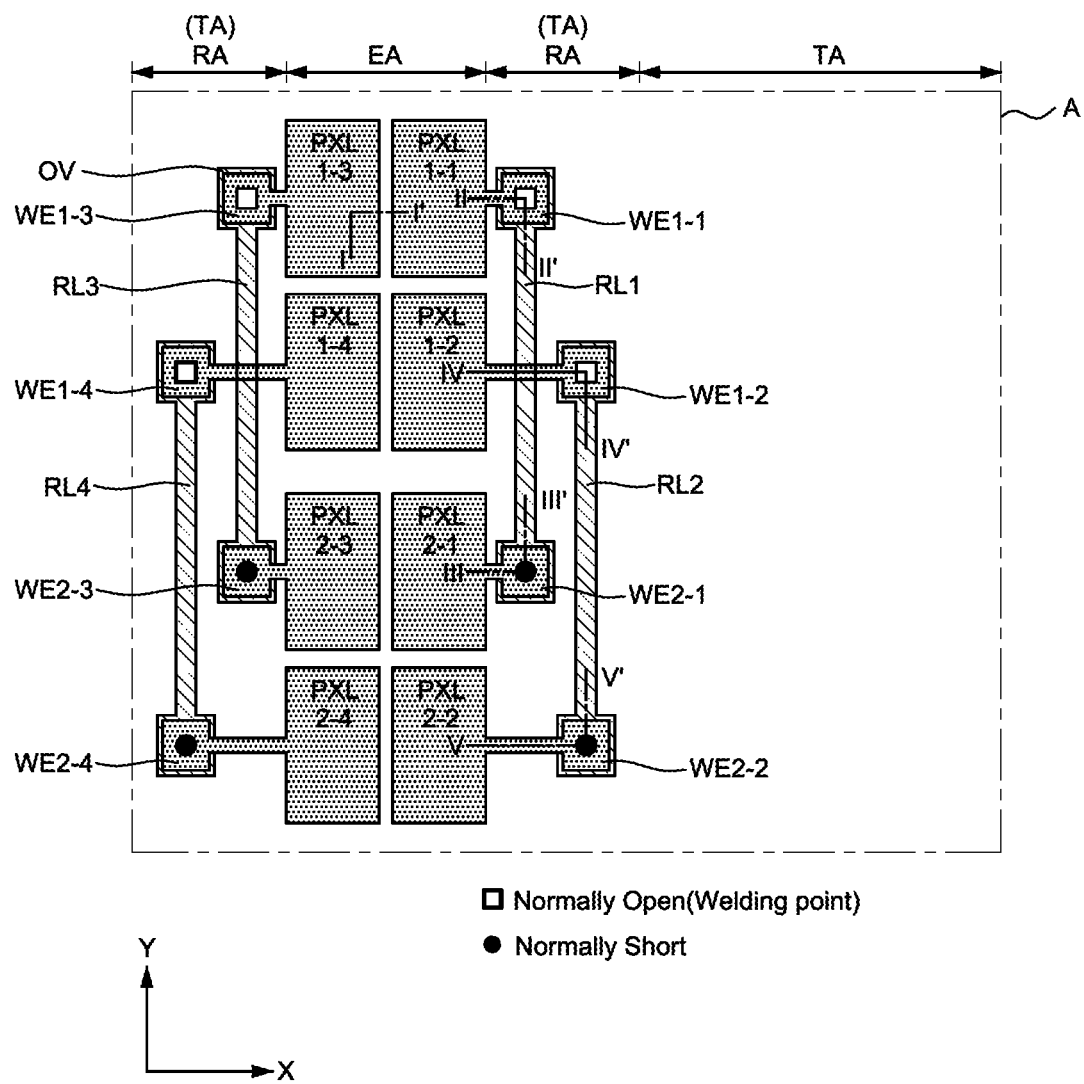
FIG. 4 is a plan view schematically illustrating part A of FIG. 1 of a first aspect of the present disclosure.
Figure 5:
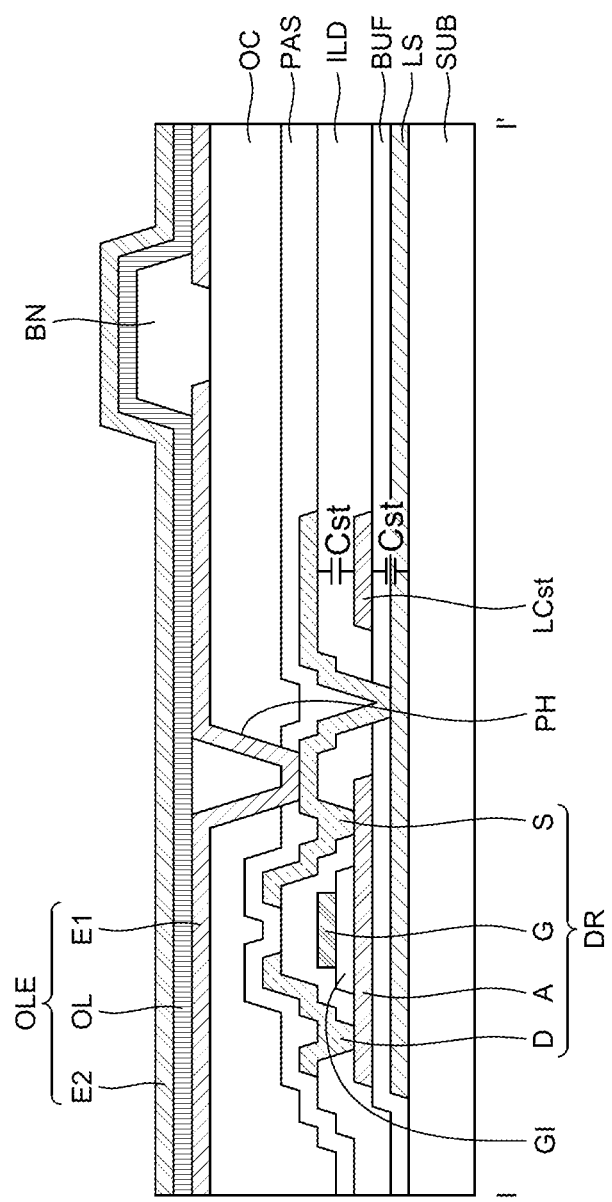
FIG. 5 is a cross-sectional view taken along line I-I' of FIG. 4.

FIG. 4 is a plan view schematically illustrating a part A of FIG. 1 of a first aspect of the present disclosure. FIG. 5 is a cross-sectional view taken along line I-I' of FIG. 4.

Referring to FIG. 4, a display device according to a first aspect of the present disclosure includes a display area (or an active area) including an emission area EA, a repair area RA, and a transmission area TA.

The emission area EA may be an area where light implementing an input image is actually emitted. The emission area EA includes sub pixels PXL having a transistor and an organic light emitting diode (or a light emitting diode). The transmission area TA may be an area where external light is transmitted to allow a user to recognize an object located on a rear surface of the display device.

The repair area RA may be an area where when a defect occurs in the sub pixel PXL, a repair process is performed. The repair area RA includes a repair structure having a welding electrode WE and a repair line RL. Most of the repair area RA may be allocated to the transmission area TA, which will be described below.

The emission area EA includes pixels. The pixels may be disposed along a first direction (for example, a Y axis direction) and a second direction (for example, an X axis direction) which intersect each other. Pixels include sub pixels PXL. Sub pixels PXL may be disposed along the first direction and the second direction which intersect each other. The pixels include red R, green G, blue B, white W sub pixels PXL, but are not limited thereto. Hereinafter, for the convenience of description, a configuration in which the pixels include red R, green G, blue B, white W sub pixels PXL will be described as an example.

To be more specific, the emission area EA includes a first pixel and a second pixel which are adjacent to each other in the first direction. The first pixel includes a 1-1 sub pixel PXL1-1, a 1-2 sub pixel PXL1-2, a 1-3 sub pixel PXL1-3, and a 1-4 sub pixel PXL1-4. Here, the 1-1 sub pixel PXL1-1 is a specific example of a first sub pixel of the first pixel. The 1-2 sub pixel PXL1-2 is a specific example of a second sub pixel of the first pixel. The 1-3 sub pixel PXL1-3 is a specific example of a third sub pixel of the first pixel. The 1-4 sub pixel PXL1-4 is a specific example of a fourth sub pixel of the first pixel. The second pixel includes a 2-1 sub pixel PXL2-1, a 2-2 sub pixel PXL2-2, a 2-3 sub pixel PXL2-3, and a 2-4 sub pixel PXL2-4. Here, the 2-1 sub pixel PXL2-1 is a specific example of a first sub pixel of the second pixel. The 2-2 sub pixel PXL2-2 is a specific example of a second sub pixel of the second pixel. The 2-3 sub pixel PXL2-3 is a specific example of a third sub pixel of the second pixel.

The 2-4 sub pixel PXL2-4 is a specific example of a fourth sub pixel of the second pixel. The 1-1 sub pixel PXL1-1 and the 2-1 sub pixel PXL2-1 emit light having the same first color. The 1-2 sub pixel PXL1-2 and the 2-2 sub pixel PXL2-2 emit light having the same second color. The 1-3 sub pixel PXL1-3 and the 2-3 sub pixel PXL2-3 emit light having the same third color. The 1-4 sub pixel PXL1-4 and the 2-4 sub pixel PXL2-4 emit light having the same fourth color. The first color, the second color, the third color, and the fourth color may be allocated as any one of red R, green G, blue B, and white W.

The sub pixels PXL disposed in one pixel may be disposed as a quad type as illustrated in the drawing.

The 1-1 sub pixel PXL1-1, the 1-2 sub pixel PXL1-2, the 2-1 sub pixel PXL2-1, and the 2-2 sub pixel PXL2-2 may be sequentially disposed along the first direction. The 1-3 sub pixel PXL1-3, the 1-4 sub pixel PXL1-4, the 2-3 sub pixel PXL2-3, and the 2-4 sub pixel PXL2-4 may be sequentially disposed along the first direction.

The 1-1 sub pixel PXL1-1 and the 1-3 sub pixel PXL1-3 may be disposed to be adjacent to each other in the second direction. The 1-2 sub pixel PXL1-2 and the 1-4 sub pixel PXL1-4 may be disposed to be adjacent to each other in the second direction. The 2-1 sub pixel PXL2-1 and the 2-3 sub pixel PXL2-3 may be disposed to be adjacent to each other in the second direction. The 2-2 sub pixel PXL2-2 and the 2-4 sub pixel PXL2-4 may be disposed to be adjacent to each other in the second direction.

Sub pixels PXL which emit the same color are disposed along the first direction. That is, the 1-1 sub pixel PXL1-1 and the 2-1 sub pixel PXL2-1 are disposed along the first direction, the 1-2 sub pixel PXL1-2 and the 2-2 sub pixel PXL2-2 are disposed along the first direction, the 1-3 sub pixel PXL1-3 and the 2-3 sub pixel PXL2-3 are disposed along the first direction, and the 1-4 sub pixel PXL1-4 and the 2-4 sub pixel PXL2-4 are disposed along the first direction.

In this case, two sub pixels PXL which emits different color light are alternately sequentially disposed along the first direction. That is, the 1-1 sub pixel PXL1-1 emitting light having a first color, the 1-2 sub pixel PXL1-2 emitting light having a second color, the 2-1 sub pixel PXL2-1 emitting light having the first color, and the 2-2 sub pixel PXL2-2 emitting light having the second color are sequentially disposed along the first direction. Further, the 1-3 sub pixel PXL1-3 emitting light having a third color, the 1-4 sub pixel PXL1-4 emitting light having a fourth color, the 2-3 sub pixel PXL2-3 emitting light having the third color, and the 2-4 sub pixel PXL2-4 emitting light having the fourth color are sequentially disposed along the first direction.

Each of the sub pixels PXL includes a transistor disposed on a substrate and an organic light emitting diode electrically connected to the transistor.

For example, further referring to FIG. 5, a light shielding layer LS is disposed on the substrate SUB. The light shielding layer LS blocks external light from being incident to suppress the generation of a photo current in the transistor. A buffer layer BUF is located on the light shielding layer LS. The buffer layer BUF serves to protect a thin film transistor which is formed in a subsequent process from impurities such as alkali ions leaked from the light shielding layer LS. The buffer layer BUF may be silicon oxide SiOx, silicon nitride SiNx, or multilayers thereof.

A semiconductor layer A of the driving transistor DR is located on the buffer layer BUF and a capacitor lower electrode LCst is disposed to be spaced apart from the semiconductor layer A. The semiconductor layer A and the capacitor lower electrode LCst may be formed of silicon semiconductor or oxide semiconductor. The silicon semiconductor may include an amorphous silicon or crystallized polycrystalline silicon. The oxide semiconductor may include IZO (InZnO) based, IGO (InGaO) based, ITO (InSnO) based, IGZO (InGaZnO) based, IGZTO (InGaZnSnO) based, GZTO (GaZnSnO) based, GZO (GaZnO) based, and ITZO (InSnZnO) based oxide semiconductor material, but is not limited thereto. The semiconductor layer A includes a drain region and a source region including a p-type or an n-type impurity and a channel formed between the drain region and the source region. The capacitor lower electrode LCst is doped with impurities to be conductive.

A gate insulating layer GI is located on the semiconductor layer A. The gate insulating layer GI may be silicon oxide SiOx, silicon nitride SiNx, or multilayers thereof. The gate electrode G is located on a location of the gate insulating layer GI corresponding to a predetermined area of the semiconductor layer A, that is, a channel when an impurity is injected. The gate electrode G is formed of any one selected from the group consisting of molybdenum (Mo), aluminum (Al), chrome (Cr), gold (Au), titanium (Ti), nickel (Ni), neodymium (Nd), and copper (Cu) or an alloy thereof. Further, the gate electrode G may be a multilayer formed of any one selected from the group consisting of molybdenum (Mo), aluminum (Al), chrome (Cr), gold (Au), titanium (Ti), nickel (Ni), neodymium (Nd), and copper (Cu) or an alloy thereof. For example, the gate electrode G may be a double layer of molybdenum/aluminum-neodymium or molybdenum/aluminum.

An interlayer insulating layer ILD which insulates the gate electrode G is located on the gate electrode G and the capacitor lower electrode LCst. The interlayer insulating layer ILD may be a silicon oxide SiOx film, a silicon nitride SiNx film, or a multilayer thereof. A source electrode S and a drain electrode D are disposed on the interlayer insulating layer ILD. The source electrode S and the drain electrode D are connected to the semiconductor layer A through contact holes which expose a source region and a drain region of the semiconductor layer A. The source electrode S and the drain electrode D may be formed of a single layer or a multilayer. When the source electrode S and the drain electrode D are single layers, the source electrode S and the drain electrode D may be formed of any one selected from the group consisting of molybdenum (Mo), aluminum (Al), chrome (Cr), gold (Au), titanium (Ti), nickel (Ni), neodymium (Nd), and copper (Cu) or an alloy thereof. Further, when the source electrode S and the drain electrode D are multiplayers, the source electrode S and the drain electrode D may be formed of a double layer of molybdenum/aluminum-neodymium or a triple layer of titanium/aluminum/titanium, molybdenum/aluminum/molybdenum, or molybdenum/aluminum-neodymium/molybdenum. Therefore, the driving transistor DR including the semiconductor layer A, the gate electrode G, the source electrode S, and the drain electrode D may be configured. Further, the source electrode S may serve as a capacitor upper electrode to configure a capacitor Cst with the capacitor lower electrode LCst.

A passivation layer PAS is located on the substrate SUB including the driving transistor DR and the capacitor Cst. The passivation layer PAS is an insulating layer which protects elements therebelow and may be a silicon oxide SiOx layer, a silicon nitride SiNx layer or a multilayer thereof. An overcoat layer OC is located on the passivation layer PAS. The overcoat layer OC may be a planarization layer which alleviates a step of a structure therebelow and may be formed of an organic material such as polyimide, benzocyclobutene series resin, or acrylate. The overcoat layer OC may be formed by a method such as spin on glass (SOG) which coats the organic material in a liquid form and then cures the organic material. In a partial area of the overcoat layer OC, a pixel contact hole PH which exposes the passivation layer PAS to expose the source electrode S is located.

The organic light emitting diode OLED includes a first electrode E1, an organic light emitting layer OL, and a second electrode E2 which are opposite to each other.

The first electrode E1 may be an anode. The first electrode E1 is connected to the source electrode S of the driving transistor DR through the pixel contact hole PH which passes through the overcoat layer OC and the passivation layer PAS. The first electrode E1 may be formed of a transparent conductive material such as indium tin oxide (ITO), indium zinc oxide (IZO), or zinc oxide (ZnO) to serve as a transmissive electrode or include a reflective layer to serve as a reflective electrode in accordance with an employed emission method. The reflective layer may be formed of aluminum (Al), copper (Cu), silver (Ag), nickel (Ni), or an alloy thereof and may be desirably formed of APC (silver/palladium/copper alloy).

A bank layer BN is disposed on the substrate SUB in which the first electrode E1 is formed. The bank layer BN may be formed of an organic material such as polyimide, benzocyclobutene series resin, or acrylate. The bank layer BN includes an opening which exposes most of the first electrode E1. The bank layer BN is disposed to expose a center portion of the first electrode E1 and cover a side edge of the first electrode E1.

The organic light emitting layer OL is disposed on the substrate SUB on which the bank layer BN is formed. The organic light emitting layer OL in which electrons and holes recombine to emit light includes an emission layer EML and further includes any one or more of a hole injection layer HIL, a hole transport layer HTL, an electron transport layer ETL, and an electron injection layer EIL.

The second electrode E2 is disposed on the organic light emitting layer OL. The second electrode E2 may be widely formed on the entire surface of the substrate SUB. The second electrode E2 may serve as a transmissive electrode or a reflective electrode in accordance with an employed emission method. When the second electrode E2 is a transmissive electrode, the second electrode E2 may be formed of a transparent conductive material such as indium tin oxide (ITO) and indium zinc oxide (IZO) and may be formed of magnesium (Mg), calcium (Ca), aluminum (Al), silver (Ag), or an alloy thereof having a thickness which is thin enough to transmit light.

The repair area RA includes a welding electrode WE and a repair line RL.

The welding electrode WE is connected to the first electrode E1 of a corresponding sub pixel PXL. The welding electrode WE may be a part branched from the first electrode E1 of the sub pixel PXL. Since the welding electrode WE is welded with a repair line RL during a repair process, the welding electrode is formed to have a predetermined area required for a process.

At least one welding electrode WE may be allocated for one sub pixel. A 1-1 welding electrode WE1-1 is connected to a first electrode of the 1-1 sub pixel PXL1-1. A 1-2 welding electrode WE1-2 is connected to a first electrode of the 1-2 sub pixel PXL1-2. A 1-3 welding electrode WE1-3 is connected to a first electrode of the 1-3 sub pixel PXL1-3. A 1-4 welding electrode WE1-4 is connected to a first electrode of the 1-4 sub pixel PXL1-4. A 2-1 welding electrode WE2-1 is connected to a first electrode of the 2-1 sub pixel PXL2-1. A 2-2 welding electrode WE2-2 is connected to a first electrode of the 2-2 sub pixel PXL2-2. A 2-3 welding electrode WE2-3 is connected to a first electrode of the 2-3 sub pixel PXL2-3. A 2-4 welding electrode WE2-4 is connected to a first electrode of the 2-4 sub pixel PXL2-4.

The repair line RL may extend in the first direction. The repair line RL which extends in the first direction may be referred to as a vertical repair line RL. One end and the other end of the repair line RL are disposed to overlap welding electrodes WE of sub pixels PXL which emit the same color light. One end of a first repair line RL1 overlaps the 1-1 welding electrode WE1-1 and the other end overlaps the 2-1 welding electrode WE2-1. One end of a second repair line RL2 overlaps the 1-2 welding electrode WE1-2 and the other end overlaps the 2-2 welding electrode WE2-2. One end of a third repair line RL3 overlaps the 1-3 welding electrode WE1-3 and the other end overlaps the 2-3 welding electrode WE2-3. One end of a fourth repair line RL4 overlaps the 1-4 welding electrode WE1-4 and the other end overlaps the 2-4 welding electrode WE2-4. In the meantime, the first repair line RL1 may be referred to as a first vertical repair line. The second repair line RL2 may be referred to as a second vertical repair line. The third repair line RL3 may be referred to as a third vertical repair line. The fourth repair line RL4 may be referred to as a fourth vertical repair line.

Figure 6A:
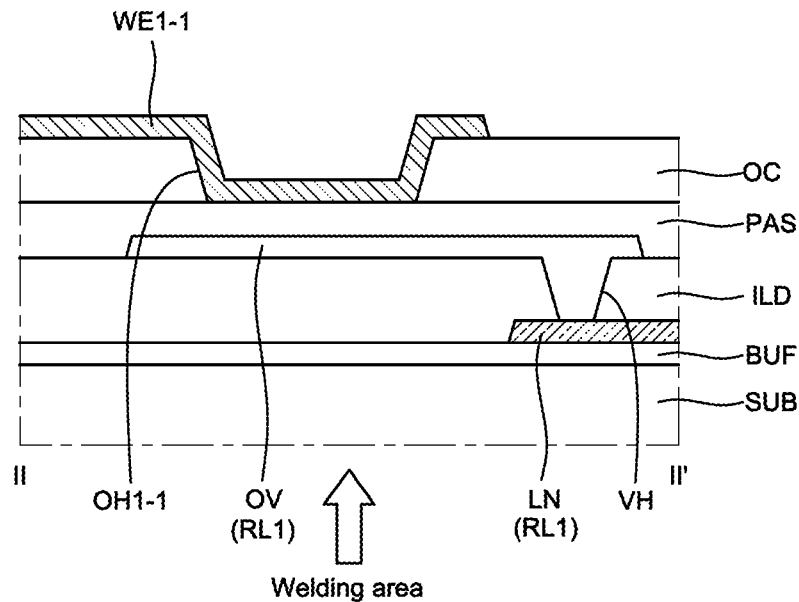
FIGS. 6A and 6B are cross-sectional views illustrating a connection relationship of a first repair line and corresponding welding electrodes, taken along lines II-II' and of FIG. 4.
Figure 6B:
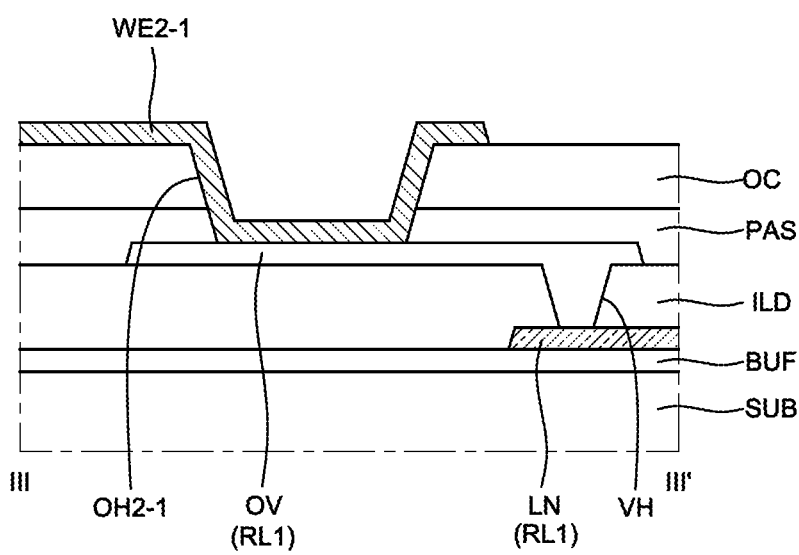

Parts of one end and the other end of the repair line RL which overlaps the welding electrode WE may be referred to overlapping units OV and a part connecting the overlapping units OV may be referred to as a connecting unit LN (as shown in FIGS. 6A and 6B). Here, the overlapping unit OV and the connecting unit LN may be formed of different materials. Specifically, the connecting unit LN may be formed of a transparent conductive material, which will be described below.

The overlapping unit OV overlaps the welding electrode WE to be welded with the welding electrode WE during the repair process so that the overlapping unit OV is formed to have a predetermined area required for the process. The welding electrode WE and the overlapping unit OV may have the same area, but are not limited thereto.

In the first aspect, any one of one end and the other end of the repair line RL is connected to a corresponding welding electrode WE and the other one is not connected to the corresponding welding electrode WE. For example, as illustrated in the drawing, one end of the first repair line RL1 is separated from the 1-1 welding electrode WE1-1 with at least one insulating layer therebetween and the other end of the first repair line RL1 may be connected to the 2-1 welding electrode WE2-1. One end of the second repair line RL2 is separated from the 1-2 welding electrode WE1-2 with at least one insulating layer therebetween and the other end of the second repair line RL2 may be connected to the 2-2 welding electrode WE2-2. One end of the third repair line RL3 is separated from the 1-3 welding electrode WE1-3 with at least one insulating layer therebetween and the other end of the third repair line RL3 may be connected to the 2-3 welding electrode WE2-3. One end of the fourth repair line RL4 is separated from the 1-4 welding electrode WE1-4 with at least one insulating layer therebetween and the other end of the fourth repair line RL4 may be connected to the 2-4 welding electrode WE2-4. Hereinafter, for the convenience of description, only configuration illustrated in the drawing will be described as an example.

When a defective sub pixel PXL is detected during an inspection process, the repair line RL and a corresponding welding electrode WE which are separated are welded to be electrically connected. For example, when it is determined that the 1-1 sub pixel PXL1-1 is defective during the inspection process, a signal applied to the 1-1 sub pixel PXL1-1 is cut by a cutting process and one end of the first repair line RL1 and the 1-1 welding electrode WE1-1 which are separated are connected by the welding process. Therefore, the first electrode of the 1-1 sub pixel PXL1-1 and the first electrode of the 2-1 sub pixel PXL2-1 may be electrically connected.

The connecting unit LN of the repair lines RL is formed of a transparent conductive material. The transparent conductive material may be any one of indium tin oxide (ITO), indium zinc oxide (IZO), and indium gallium zinc oxide (IGZO), but is not limited thereto. In the first aspect of the present disclosure, since the repair line RL has a predetermined transmittance, an area of the repair area RA where the repair line RL is disposed may also be allocated to a transmission area TA. Therefore, according to the present disclosure, an area of the transmission area TA may be sufficiently ensured while ensuring a required area of the emission area EA regardless of the location of the repair line RL so that a transparent display device with a good quality may be provided.

Figure 7A:
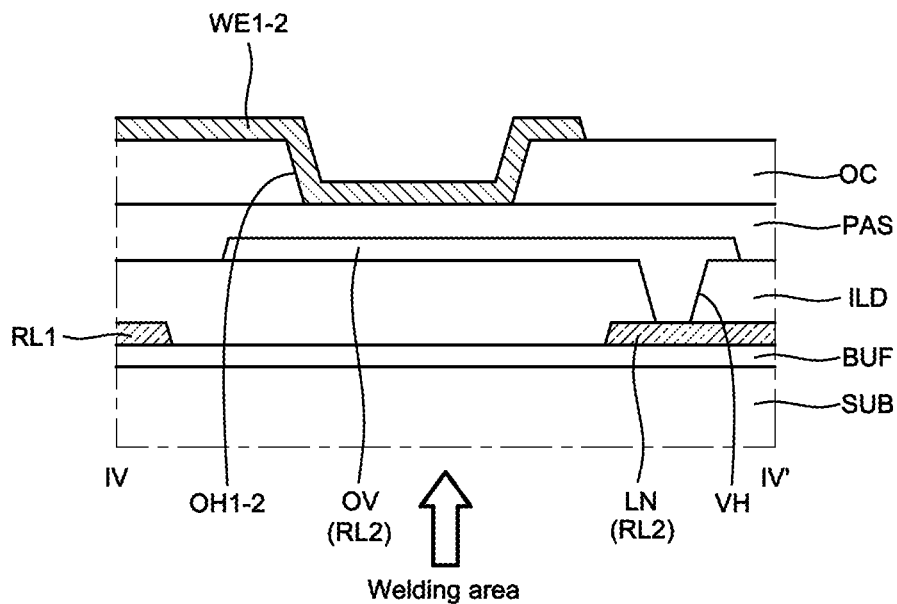
FIGS. 7A and 7B are cross-sectional views illustrating a connection relationship of a second repair line and corresponding welding electrodes, taken along lines IV-IV' and V-V' of FIG. 4.
Figure 7B:
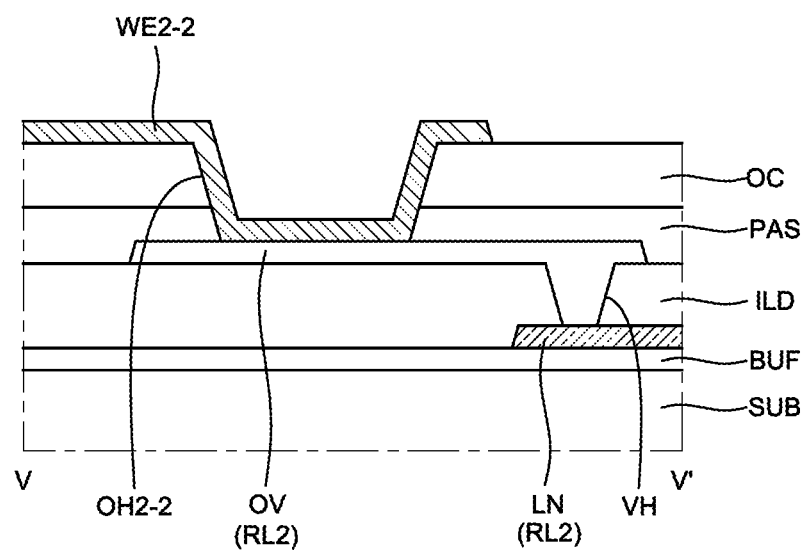

Hereinafter, a connection relationship of the repair line and the welding electrode will be described with reference to FIGS. 6A, 6B and 7A, 7B. FIGS. 6A and 6B are cross-sectional views illustrating a connection relationship of a first repair line and corresponding welding electrodes, taken along lines II-II' and III-III' of FIG. 4 respectively. FIGS. 7A and 7B are cross-sectional views illustrating a connection relationship of a second repair line and corresponding welding electrodes, taken along lines IV-IV' and V-V' of FIG. 4 respectively.

Referring to FIGS. 6A and 6B together with FIG. 4, the connecting unit LN of the first repair line RL1 may be formed of the same material on the same layer as the semiconductor layer A of the transistor. That is, the connecting unit LN of the first repair line RL1 may be disposed on the buffer layer BUF.

For example, the connecting unit LN of the first repair line RL1 may be formed simultaneously with the formation of the semiconductor layer A. The connecting unit LN of the first repair line RL1 is formed to be conductive together during a step of making the source region and the drain region of the semiconductor layer A conductive to have a conductivity. In this case, a separate process of forming the connecting unit LN of the first repair line RL1 is not necessary so that it is advantageous to improve a manufacturing cost and a process yield.

Even though it is not illustrated in the drawing, the connecting unit LN of the first repair line RL1 may be formed on the same layer as the source/drain electrode S and D of the transistor. Alternatively, the connecting unit LN of the first repair line RL1 may be formed on the same layer as the light shielding layer LS of the transistor. Also in this case, the connecting unit LN of the first repair line RL1 is formed of a transparent conductive material.

The overlapping unit OV of the first repair line RL1 may be formed on the same layer as the source/drain electrode S and D of the transistor. Even though it is not illustrated in the drawing, the overlapping unit OV of the first repair line RL1 may be formed on the same layer as the light shielding layer LS of the transistor. The overlapping unit OV and the connecting unit LN of the first repair line RL1 may be connected through a through hole VH which passes through the insulating layer interposed therebetween. The through hole VH may be disposed so as not to overlap a welding area.

Referring to FIG. 6A, the 1-1 welding electrode WE1-1 which overlaps one end of the first repair line RL1, that is, the overlapping unit OV is formed on the same layer as the first electrode. That is, the 1-1 welding electrode WE1-1 is disposed on the overcoat layer OC. The 1-1 welding electrode WE1-1 may be a part branched from the first electrode of the 1-1 sub pixel PXL1-1. The overlapping unit OV of the first repair line RL1 and the 1-1 welding electrode WE1-1 are electrically separated from each other with at least one insulating layer interposed therebetween.

Here, on the overcoat layer OC, a 1-1 open hole OH1-1 which exposes a part of the passivation layer PAS may be formed. In this case, at least a part of the 1-1 welding electrode WE1-1 is located on the passivation layer PAS in the 1-1 open hole OH1-1 which passes through the overcoat layer OC. An area where the 1-1 open hole OH1-1 is formed overlaps an area where laser is irradiated. According to the present disclosure, the overcoat layer OC having a predetermined thickness is removed in advance from an area where the welding process is performed so that the welding process may be easily performed without causing a process failure due to the thickness of the insulating layer. Even though it is not illustrated in the drawing, the 1-1 open hole OH1-1 may be formed to pass through the overcoat layer OC and the passivation layer PAS to expose a part of the interlayer insulating layer ILD.

Referring to FIG. 6B, the 2-1 welding electrode WE2-1 which overlaps the other end of the first repair line RL1, that is, the overlapping unit OV is formed on the same layer as the first electrode. That is, the 2-1 welding electrode WE2-1 is disposed on the overcoat layer OC. The 2-1 welding electrode WE2-1 may be a part branched from the first electrode of the 2-1 sub pixel PXL2-1.

A 2-1 open hole OH2-1 which exposes the other end of the first repair line RL1, that is, a part of the overlapping unit OV may be formed in the overcoat layer OC, the passivation layer PAS, and the interlayer insulating layer ILD. The 2-1 open hole OH2-1 passes through the overcoat layer OC, the passivation layer PAS, and the interlayer insulating layer ILD. At least a part of the 2-1 welding electrode WE2-1 may be in direct contact with the first repair line RL1 through the 2-1 open hole OH2-1.

Referring to FIGS. 7A and 7B together with FIG. 4, the connecting unit LN of the second repair line RL2 may be formed of the same material on the same layer as the semiconductor layer A of the transistor. That is, the connecting unit LN of the second repair line RL2 may be disposed on the buffer layer BUF.

For example, the connecting unit LN of the second repair line RL2 may be formed simultaneously with the formation of the semiconductor layer A. The connecting unit LN of the second repair line RL2 is formed to be conductive together during a step of making the source region and the drain region of the semiconductor layer A conductive to have a conductivity. In this case, a separate process of forming the connecting unit LN of the second repair line RL2 is not necessary so that it is advantageous to improve a manufacturing cost and a process yield.

Even though it is not illustrated in the drawing, the connecting unit LN of the second repair line RL2 may be formed on the same layer as the source/drain electrode S and D of the transistor. Alternatively, the connecting unit LN of the second repair line RL2 may be formed on the same layer as the light shielding layer LS of the transistor. Also in this case, the connecting unit LN of the second repair line RL2 is formed of a transparent conductive material.

The overlapping unit OV of the second repair line RL2 may be formed on the same layer as the source/drain electrode S and D of the transistor. Even though it is not illustrated in the drawing, the overlapping unit OV of the second repair line RL2 may be formed on the same layer as the light shielding layer LS of the transistor. The overlapping unit OV and the connecting unit LN of the second repair line RL2 may be connected through a through hole VH which passes through the insulating layer interposed therebetween. The through hole VH may be disposed so as not to overlap a welding area.

Referring to FIG. 7A, the 1-2 welding electrode WE1-2 which overlaps one end of the second repair line RL2, that is, the overlapping unit OV is formed on the same layer as the first electrode. That is, the 1-2 welding electrode WE1-2 is disposed on the overcoat layer OC. The 1-2 welding electrode WE1-2 may be a part branched from the first electrode of the 1-2 sub pixel PXL1-2. The overlapping unit OV of the second repair line RL2 and the 1-2 welding electrode WE1-2 are electrically separated from each other with at least one insulating layer interposed therebetween.

For example, on the overcoat layer OC, a 1-2 open hole OH1-2 which exposes a part of the passivation layer PAS may be formed. In this case, at least a part of the 1-2 welding electrode WE1-2 is located on the passivation layer PAS in the 1-2 open hole OH1-2 which passes through the overcoat layer OC. An area where the 1-2 open hole OH1-2 is formed overlaps an area where laser is irradiated. According to the present disclosure, the overcoat layer OC having a predetermined thickness is removed in advance from an area where the welding process is performed so that the welding process may be easily performed without causing a process failure due to the thickness of the insulating layer. Even though it is not illustrated in the drawing, the 1-2 open hole OH1-2 may be formed to pass through the overcoat layer OC and the passivation layer PAS to expose a part of the interlayer insulating layer ILD.

Referring to FIG. 7B, the 2-2 welding electrode WE2-2 which overlaps the other end of the second repair line RL2, that is, the overlapping unit OV is formed on the same layer as the first electrode. That is, the 2-2 welding electrode WE2-2 is disposed on the overcoat layer OC. The 2-2 welding electrode WE2-2 may be a part branched from the first electrode of the 2-2 sub pixel PXL2-2.

A 2-2 open hole OH2-2 which exposes the other end of the second repair line RL2, that is, a part of the overlapping unit OV may be formed in the overcoat layer OC, the passivation layer PAS, and the interlayer insulating layer ILD. The 2-2 open hole OH2-2 passes through the overcoat layer OC, the passivation layer PAS, and the interlayer insulating layer ILD. At least a part of the 2-2 welding electrode WE2-2 may be in direct contact with the second repair line RL2 through the 2-2 open hole OH2-2.

Even though it is not illustrated in the drawing, a connection structure of the third repair line RL3 may be configured as illustrated in FIGS. 6A and 6B and a connection structure of the fourth repair line RL4 may be configured as illustrated in FIGS. 7A and 7B.

Figure 8:
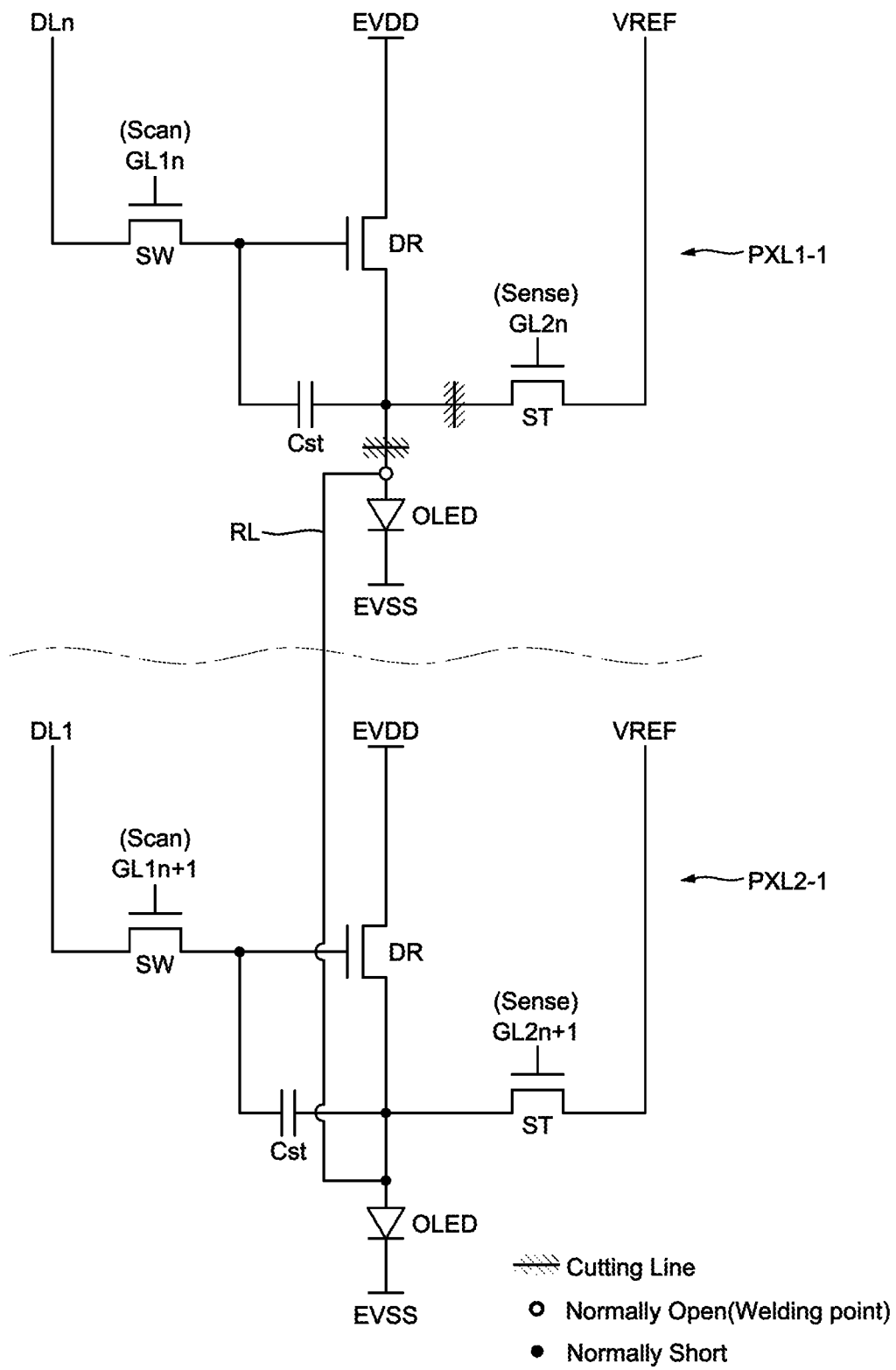
FIG. 8 is a schematic circuit diagram of a sub pixel for explaining a repair process and a structure thereof according to a first aspect of the present disclosure.

FIG. 8 is a schematic circuit diagram of a sub pixel for explaining a repair process and a structure thereof according to a first aspect of the present disclosure.

The display device according to the first exemplary aspect of the present disclosure includes a repair structure which performs a repair process. The repair process may include an inspection process of detecting whether the sub pixel PXL is defective, a cutting process of cutting a signal to be applied to a sub pixel PXL determined as a defective sub pixel, and a welding process of connecting a sub pixel PXL and the defective sub pixel PXL which are adjacent to each other to apply a signal of the adjacent sub pixel PXL to the defective sub pixel.

Referring to FIG. 8, a 1-1 sub pixel PXL1-1 and a 2-1 sub pixel PXL2-1 are sub pixels PXL which emit light having the same color. When the 1-1 sub pixel PXL1-1 is determined as a defective sub pixel during the inspection process, the cutting process is performed to cut the signal to be applied to the 1-1 sub pixel PXL1-1. For example, the cutting process may include a process of cutting between the source electrode of the driving transistor DR and the first electrode of the organic light emitting diode OLED and a process of cutting between the source electrode of the sensing transistor ST and the first electrode of the organic light emitting diode OLED.

Next, the welding process is performed to connect the first electrode of the 1-1 sub pixel PXL1-1 and the first electrode of the 2-1 sub pixel PXL2-1. In the first aspect, the repair line RL is electrically connected to any one of the first electrode of the 1-1 sub pixel PXL1-1 and the first electrode of the 2-1 sub pixel PXL2-1. Therefore, during the welding process, only a process of electrically connecting the repair line RL to the other one of the first electrode of the 1-1 sub pixel PXL1-1 and the first electrode of the 2-1 sub pixel PXL2-1 may be performed.

Figure 9:
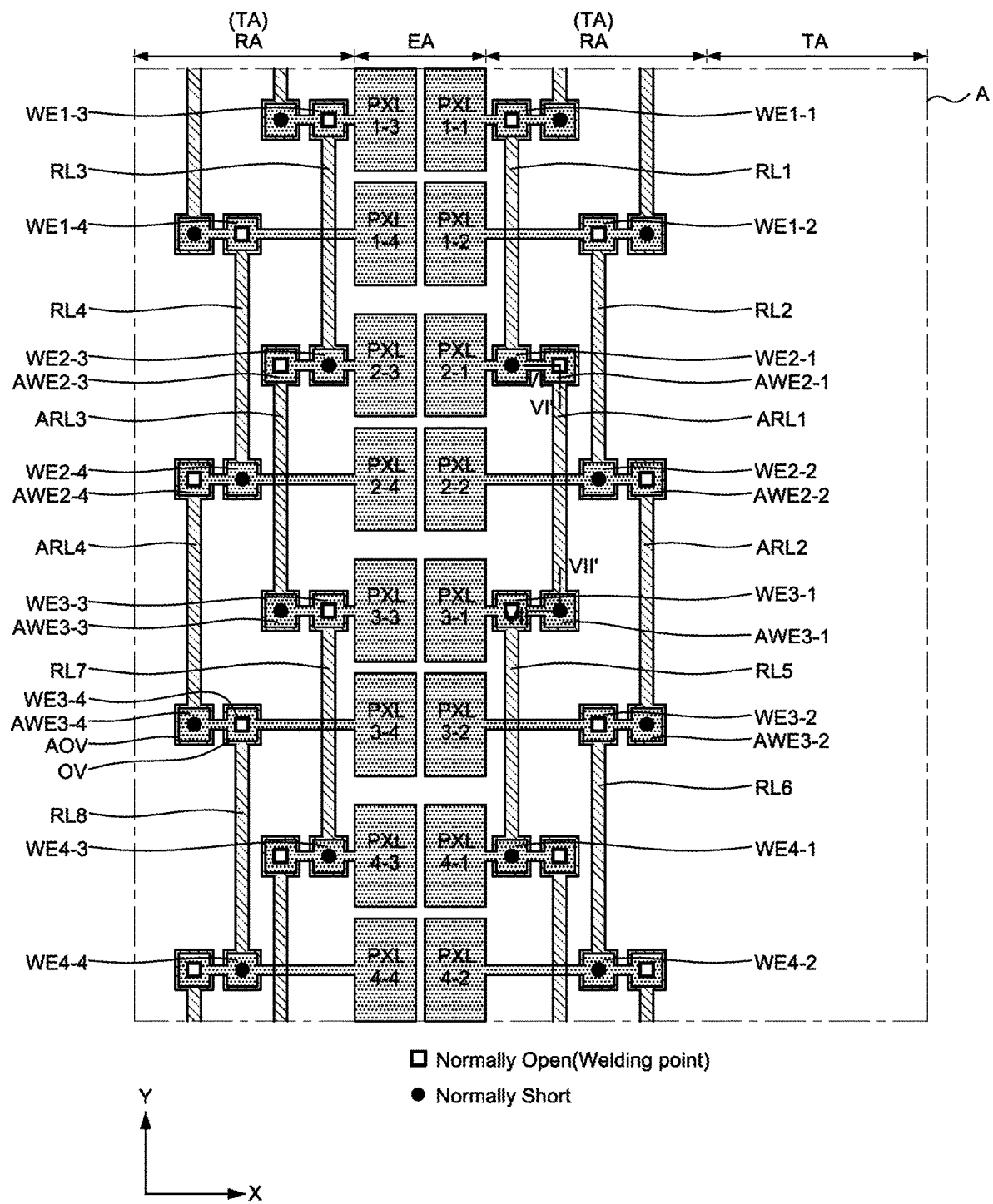
FIG. 9 is a plan view schematically illustrating part A of FIG. 1 of a second aspect of the present disclosure.
Figure 10A:
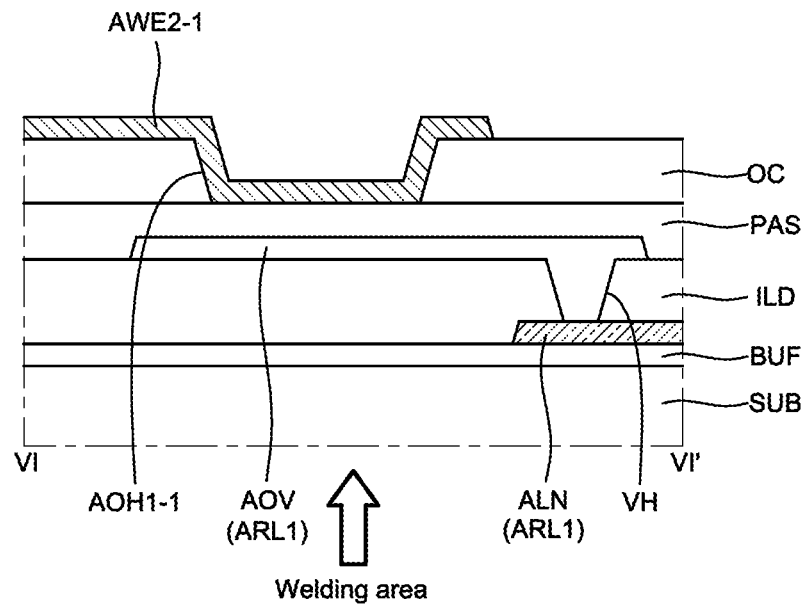
FIGS. 10A and 10B are cross-sectional views illustrating a connection relationship of a first auxiliary repair line and corresponding auxiliary welding electrodes, taken along lines VI-VI' and VII-VII' of FIG. 9.
Figure 10B:
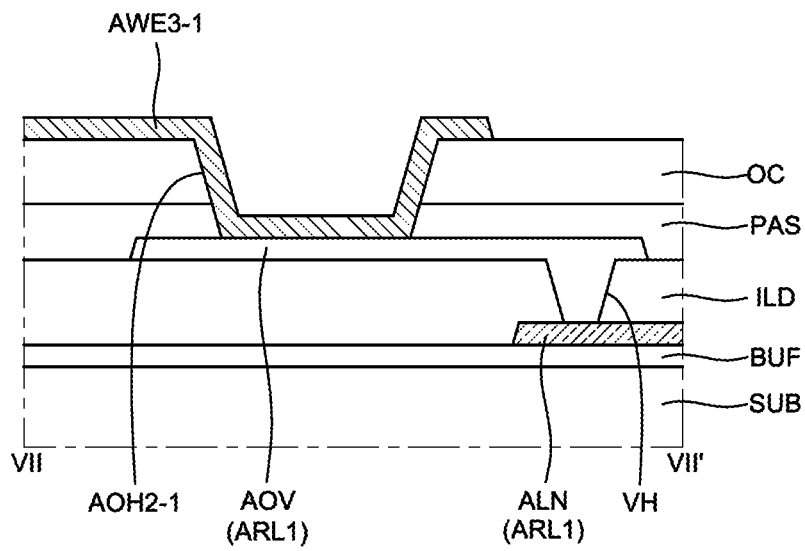

FIG. 9 is a plan view schematically illustrating a part A of FIG. 1 of a second aspect of the present disclosure. FIGS. 10A and 10B are cross-sectional views illustrating a connection relationship of a first auxiliary repair line and corresponding auxiliary welding electrodes, taken along lines VI-VI' and VII-VII' of FIG. 9 respectively. In the description of the second aspect of the present disclosure, a description of the configuration which is substantially the same as the first aspect may be omitted.

Referring to FIG. 9, a display device according to a second aspect of the present disclosure includes a display area including an emission area EA, a repair area RA, and a transmission area TA.

The emission area EA may be an area where light implementing an input image is actually emitted. The emission area EA includes sub pixels PXL having a transistor and an organic light emitting diode (or a light emitting diode). The transmission area TA may be an area where external light is transmitted to allow a user to recognize an object located on a rear surface of the display device.

The repair area RA may be an area where when a defect occurs in the sub pixel PXL, a repair process is performed. The repair area RA includes a repair structure having a welding electrode WE and a repair line RL. Most of the repair area RA may be allocated to the transmission area TA, which will be described below.

The emission area EA includes pixels. The pixels may be disposed along a first direction (for example, a Y axis direction) and a second direction (for example, an X axis direction) which intersect each other. Pixels include sub pixels PXL. Sub pixels PXL may be disposed along the first direction and the second direction which intersect each other. The pixels include red R, green G, blue B, white W sub pixels PXL, but are not limited thereto. Hereinafter, for the convenience of description, a configuration in which the pixels include red R, green G, blue B, white W sub pixels PXL will be described as an example.

To be more specific, the emission area EA includes a first pixel, a second pixel, a third pixel, and a fourth pixel which are adjacent to each other in the first direction. Two pixels adjacent in the first direction may form a pair. That is, the first pixel and the second pixel form a first pair and the third pixel and the fourth pixel form a second pair.

The first pixel includes a 1-1 sub pixel PXL1-1, a 1-2 sub pixel PXL1-2, a 1-3 sub pixel PXL1-3, and a 1-4 sub pixel PXL1-4. Here, the 1-1 sub pixel PXL1-1 is a specific example of a first sub pixel of the first pixel. The 1-2 sub pixel PXL1-2 is a specific example of a second sub pixel of the first pixel. The 1-3 sub pixel PXL1-3 is a specific example of a third sub pixel of the first pixel. The 1-4 sub pixel PXL1-4 is a specific example of a fourth sub pixel of the first pixel. The second pixel includes a 2-1 sub pixel PXL2-1, a 2-2 sub pixel PXL2-2, a 2-3 sub pixel PXL2-3, and a 2-4 sub pixel PXL2-4. Here, the 2-1 sub pixel PXL2-1 is a specific example of a first sub pixel of the second pixel. The 2-2 sub pixel PXL2-2 is a specific example of a second sub pixel of the second pixel. The 2-3 sub pixel PXL2-3 is a specific example of a third sub pixel of the second pixel. The 2-4 sub pixel PXL2-4 is a specific example of a fourth sub pixel of the second pixel.

The third pixel includes a 3-1 sub pixel PXL3-1, a 3-2 sub pixel PXL3-2, a 3-3 sub pixel PXL3-3, and a 3-4 sub pixel PXL3-4. Here, the 3-1 sub pixel PXL3-1 is a specific example of a first sub pixel of the third pixel. The 3-2 sub pixel PXL3-2 is a specific example of a second sub pixel of the third pixel. The 3-3 sub pixel PXL3-3 is a specific example of a third sub pixel of the third pixel. The 3-4 sub pixel PXL3-4 is a specific example of a fourth sub pixel of the third pixel. The fourth pixel includes a 4-1 sub pixel PXL4-1, a 4-2 sub pixel PXL4-2, a 4-3 sub pixel PXL4-3, and a 4-4 sub pixel PXL4-4. Here, the 4-1 sub pixel PXL4-1 is a specific example of a first sub pixel of the fourth pixel. The 4-2 sub pixel PXL4-2 is a specific example of a second sub pixel of the fourth pixel. The 4-3 sub pixel PXL4-3 is a specific example of a third sub pixel of the fourth pixel. The 4-4 sub pixel PXL4-4 is a specific example of a fourth sub pixel of the fourth pixel.

The 1-1 sub pixel PXL1-1, the 2-1 sub pixel PXL2-1, the 3-1 sub pixel PXL3-1, and the 4-1 sub pixel PXL4-1 emit light having the same first color. The 1-2 sub pixel PXL1-2, the 2-2 sub pixel PXL2-2, the 3-2 sub pixel PXL3-2, and the 4-2 sub pixel PXL4-2 emit light having the same second color. The 1-3 sub pixel PXL1-3, the 2-3 sub pixel PXL2-3, the 3-3 sub pixel PXL3-3, and the 4-3 sub pixel PXL4-3 emit light having the same third color. The 1-4 sub pixel PXL1-4, the 2-4 sub pixel PXL2-4, the 3-4 sub pixel PXL3-4, and the 4-4 sub pixel PXL4-4 emit light having the same fourth color. The first color, the second color, the third color, and the fourth color may be allocated as any one of red R, green G, blue B, and white W.

The sub pixels PXL disposed in one pixel may be disposed as a quad type as illustrated in the drawing.

The 1-1 sub pixel PXL1-1, the 1-2 sub pixel PXL1-2, the 2-1 sub pixel PXL2-1, the 2-2 sub pixel PXL2-2, the 3-1 sub pixel PXL3-1, the 3-2 sub pixel PXL3-2, the 4-1 sub pixel PXL4-1, and the 4-2 sub pixel PXL4-2 may be sequentially disposed along the first direction. The 1-3 sub pixel PXL1-3, the 1-4 sub pixel PXL1-4, the 2-3 sub pixel PXL2-3, the 2-4 sub pixel PXL2-4, the 3-3 sub pixel PXL3-3, the 3-4 sub pixel PXL3-4, the 4-3 sub pixel PXL4-3, and the 4-4 sub pixel PXL4-4 may be sequentially disposed along the first direction.

The 1-1 sub pixel PXL1-1 and the 1-3 sub pixel PXL1-3 may be disposed to be adjacent to each other in the second direction. The 1-2 sub pixel PXL1-2 and the 1-4 sub pixel PXL1-4 may be disposed to be adjacent to each other in the second direction. The 2-1 sub pixel PXL2-1 and the 2-3 sub pixel PXL2-3 may be disposed to be adjacent to each other in the second direction. The 2-2 sub pixel PXL2-2 and the 2-4 sub pixel PXL2-4 may be disposed to be adjacent to each other in the second direction. The 3-1 sub pixel PXL3-1 and the 3-3 sub pixel PXL3-3 may be disposed to be adjacent to each other in the second direction. The 3-2 sub pixel PXL3-2 and the 3-4 sub pixel PXL3-4 may be disposed to be adjacent to each other in the second direction. The 4-1 sub pixel PXL4-1 and the 4-3 sub pixel PXL4-3 may be disposed to be adjacent to each other in the second direction. The 4-2 sub pixel PXL4-2 and the 4-4 sub pixel PXL4-4 may be disposed to be adjacent to each other in the second direction.

The repair area RA includes a welding electrode WE, a repair line RL, an auxiliary welding electrode AWE, and an auxiliary repair line ARL.

The welding electrode WE is connected to a first electrode E1 of a corresponding sub pixel PXL. The welding electrode WE may be a part branched from the first electrode E1 of the sub pixel PXL. Since the welding electrode WE is welded with a repair line RL during a repair process, the welding electrode is formed to have a predetermined area required for a process.

At least one welding electrode WE may be allocated for one sub pixel.

A 1-1 welding electrode WE1-1 is connected to a first electrode of the 1-1 sub pixel PXL1-1. A 1-2 welding electrode WE1-2 is connected to a first electrode of the 1-2 sub pixel PXL1-2. A 1-3 welding electrode WE1-3 is connected to a first electrode of the 1-3 sub pixel PXL1-3. A 1-4 welding electrode WE1-4 is connected to a first electrode of the 1-4 sub pixel PXL1-4. A 2-1 welding electrode WE2-1 is connected to a first electrode of the 2-1 sub pixel PXL2-1. A 2-2 welding electrode WE2-2 is connected to a first electrode of the 2-2 sub pixel PXL2-2. A 2-3 welding electrode WE2-3 is connected to a first electrode of the 2-3 sub pixel PXL2-3. A 2-4 welding electrode WE2-4 is connected to a first electrode of the 2-4 sub pixel PXL2-4.

A 3-1 welding electrode WE3-1 is connected to a first electrode of the 3-1 sub pixel PXL3-1. A 3-2 welding electrode WE3-2 is connected to a first electrode of the 3-2 sub pixel PXL3-2. A 3-3 welding electrode WE3-3 is connected to a first electrode of the 3-3 sub pixel PXL3-3. A 3-4 welding electrode WE3-4 is connected to a first electrode of the 3-4 sub pixel PXL3-4. A 4-1 welding electrode WE4-1 is connected to a first electrode of the 4-1 sub pixel PXL4-1. A 4-2 welding electrode WE4-2 is connected to a first electrode of the 4-2 sub pixel PXL4-2. A 4-3 welding electrode WE4-3 is connected to a first electrode of the 4-3 sub pixel PXL4-3. A 4-4 welding electrode WE4-4 is connected to a first electrode of the 4-4 sub pixel PXL4-4.

The repair line RL may be used to repair between sub pixels of pixels which form a pair. The repair line RL may extend in the first direction. The repair line RL which extends in the first direction may be referred to as a vertical repair line RL. One end and the other end of the repair line RL are disposed to overlap welding electrodes WE of sub pixels PXL which emit the same color light.

One end of a first repair line RL1 overlaps the 1-1 welding electrode WE1-1 and the other end overlaps the 2-1 welding electrode WE2-1. One end of a second repair line RL2 overlaps the 1-2 welding electrode WE1-2 and the other end overlaps the 2-2 welding electrode WE2-2. One end of a third repair line RL3 overlaps the 1-3 welding electrode WE1-3 and the other end overlaps the 2-3 welding electrode WE2-3. One end of a fourth repair line RL4 overlaps the 1-4 welding electrode WE1-4 and the other end overlaps the 2-4 welding electrode WE2-4. In the meantime, the first repair line RL1 may be referred to as a first vertical repair line. The second repair line RL2 may be referred to as a second vertical repair line. The third repair line RL3 may be referred to as a third vertical repair line. The fourth repair line RL4 may be referred to as a fourth vertical repair line.

One end of a fifth repair line RL5 overlaps the 3-1 welding electrode WE3-1 and the other end overlaps the 4-1 welding electrode WE4-1. One end of a sixth repair line RL6 overlaps the 3-2 welding electrode WL3-2 and the other end overlaps the 4-2 welding electrode WE4-2. One end of a seventh repair line RL7 overlaps the 3-3 welding electrode WE3-3 and the other end overlaps the 4-3 welding electrode WE4-3. One end of an eighth repair line RL8 overlaps the 3-4 welding electrode WE3-4 and the other end overlaps the 4-4 welding electrode WE4-4. In the meantime, the fifth repair line RL5 may be referred to as a fifth vertical repair line. The sixth repair line RL6 may be referred to as a sixth vertical repair line. The seventh repair line RL7 may be referred to as a seventh vertical repair line. The eighth repair line RL8 may be referred to as an eighth vertical repair line.

Parts of one end and the other end of the repair line RL which overlap the welding electrode WE may be referred to as overlapping units OV. The overlapping unit OV overlaps the welding electrode WE to be welded with the welding electrode WE during the repair process so that the overlapping unit OV is formed to have a predetermined area required for the process. The welding electrode WE and the overlapping unit OV may have the same area, but are not limited thereto.

In the second aspect, any one of one end and the other end of the repair line RL is connected to a corresponding welding electrode WE and the other one is not connected to the corresponding welding electrode WE.

For example, one end of the first repair line RL1 is separated from the 1-1 welding electrode WE1-1 with at least one insulating layer therebetween and the other end of the first repair line RL1 may be connected to the 2-1 welding electrode WE2-1. One end of the second repair line RL2 is separated from the 1-2 welding electrode WE1-2 with at least one insulating layer therebetween and the other end of the second repair line RL2 may be connected to the 2-2 welding electrode WE2-2. One end of the third repair line RL3 is separated from the 1-3 welding electrode WE1-3 with at least one insulating layer therebetween and the other end of the third repair line RL3 may be connected to the 2-3 welding electrode WE2-3. One end of the fourth repair line RL4 is separated from the 1-4 welding electrode WE1-4 with at least one insulating layer therebetween and the other end of the fourth repair line RL4 may be connected to the 2-4 welding electrode WE2-4.

One end of the fifth repair line RL5 is separated from the 3-1 welding electrode WE3-1 with at least one insulating layer therebetween and the other end of the fifth repair line RL5 may be connected to the 4-1 welding electrode WE4-1. One end of the sixth repair line RL6 is separated from the 3-2 welding electrode WE3-2 with at least one insulating layer therebetween and the other end of the sixth repair line RL6 may be connected to the 4-2 welding electrode WE4-2. One end of the seventh repair line RL7 is separated from the 3-3 welding electrode WE3-3 with at least one insulating layer therebetween and the other end of the seventh repair line RL7 may be connected to the 4-3 welding electrode WE4-3. One end of the eighth repair line RL8 is separated from the 3-4 welding electrode WE3-4 with at least one insulating layer therebetween and the other end of the eighth repair line RL8 may be connected to the 4-4 welding electrode WE4-4.

When a defective sub pixel PXL is detected during an inspection process, the repair line RL and a corresponding welding electrode WE which are separated are welded to be electrically connected. For example, when the 1-1 sub pixel PXL1-1 is determined as a defective sub pixel during the inspection process, a signal to be applied to the 1-1 sub pixel PXL1-1 is cut by the cutting process and one end of the first repair line RL1 and the 1-1 welding electrode WE1-1 which are separated are connected by the welding process.

As described above, according to the second aspect of the present disclosure, the repair between sub pixels PXL of pixels which form a pair may be allowed using the repair line RL.

In addition, according to the second aspect of the present disclosure, the repair between sub pixels PXL of pixels which form different pairs may be allowed. To this end, the display device according to the second exemplary aspect of the present disclosure may further include an auxiliary welding electrode AWE and an auxiliary repair line ARL. That is, the auxiliary welding electrode AWE and the auxiliary repair line ARL may be used to repair between sub pixels of pixels which form different pairs. Hereinafter, for the convenience of description, only a repair structure between the second pixel which configures the first pair and the third pixel which configures the second pair will be described as an example.

The auxiliary welding electrode AWE is connected to a first electrode of a corresponding sub pixel PXL. The auxiliary welding electrode AWE may be a part branched from the first electrode of the sub pixel PXL. The auxiliary welding electrode AWE may be a part branched from the welding electrode WE connected to the first electrode of the sub pixel PXL. Since the auxiliary welding electrode AWE is welded with an auxiliary repair line ARL during a repair process, the auxiliary welding electrode is formed to have a predetermined area required for a process.

At least one auxiliary welding electrode AWE may be allocated for one sub pixel. For example, a 2-1 auxiliary welding electrode AWE2-1 is connected to the first electrode of the 2-1 sub pixel PXL2-1. A 2-2 auxiliary welding electrode AWE2-2 is connected to the first electrode of the 2-2 sub pixel PXL2-2. A 2-3 auxiliary welding electrode AWE2-3 is connected to the first electrode of the 2-3 sub pixel PXL2-3. A 2-4 auxiliary welding electrode AWE2-4 is connected to the first electrode of the 2-4 sub pixel PXL2-4. A 3-1 auxiliary welding electrode AWE3-1 is connected to the first electrode of the 3-1 sub pixel PXL3-1. A 3-2 auxiliary welding electrode AWE3-2 is connected to the first electrode of the 3-2 sub pixel PXL3-2. A 3-3 auxiliary welding electrode AWE3-3 is connected to the first electrode of the 3-3 sub pixel PXL3-3. A 3-4 auxiliary welding electrode AWE3-4 is connected to the first electrode of the 3-4 sub pixel PXL3-4.

The auxiliary repair line ARL may extend in the first direction.

One end of a first auxiliary repair line ARL1 overlaps the 2-1 auxiliary welding electrode AWE2-1 and the other end overlaps the 3-1 auxiliary welding electrode AWE3-1. One end of a second auxiliary repair line ARL2 overlaps the 2-2 auxiliary welding electrode AWE2-2 and the other end overlaps the 3-2 auxiliary welding electrode AWE3-2. One end of a third auxiliary repair line ARL3 overlaps the 2-3 auxiliary welding electrode AWE2-3 and the other end overlaps the 3-3 auxiliary welding electrode AWE3-3. One end of a fourth auxiliary repair line ARL4 overlaps the 2-4 auxiliary welding electrode AWE2-4 and the other end overlaps the 3-4 auxiliary welding electrode AWE3-4.

Parts of one end and the other end of the auxiliary repair line ARL which overlap the auxiliary welding electrode AWE may be referred to as auxiliary overlapping units AOV. That is, one end and the other end of the auxiliary repair line ARL may be referred to as auxiliary overlapping units AOV and a part which connects the auxiliary overlapping units AOV may be referred to as an auxiliary connecting unit ALN. Here, the auxiliary overlapping unit AOV and the auxiliary connecting unit ALN may be formed of different materials. Specifically, the auxiliary connecting unit ALN may be formed of a transparent conductive material, which will be described below. For example, the auxiliary overlapping unit AOV may be formed of the same material on the same layer as the overlapping unit OV and the auxiliary connecting unit ALN may be formed of the same material on the same layer as the connecting unit LN.

The auxiliary overlapping unit AOV overlaps the auxiliary welding electrode AWE to be welded with the auxiliary welding electrode AWE during the repair process so that the auxiliary overlapping unit AOV is formed to have a predetermined area required for the process. The auxiliary welding electrode AWE and the auxiliary overlapping unit AOV may have the same area, but are not limited thereto.

In the second aspect, any one of one end and the other end of the auxiliary repair line ARL is connected to a corresponding auxiliary welding electrode AWE and the other one is not connected to the corresponding auxiliary welding electrode AWE.

For example, one end of the first auxiliary repair line ARL1 is separated from the 2-1 auxiliary welding electrode AWE2-1 with at least one insulating layer therebetween and the other end of the first auxiliary repair line ARL1 may be connected to the 3-1 auxiliary welding electrode AWE3-1. One end of the second auxiliary repair line ARL2 is separated from the 2-2 auxiliary welding electrode AWE2-2 with at least one insulating layer therebetween and the other end of the second auxiliary repair line ARL2 may be connected to the 3-2 auxiliary welding electrode AWE3-2. One end of the third auxiliary repair line ARL3 is separated from the 2-3 auxiliary welding electrode AWE2-3 with at least one insulating layer therebetween and the other end of the third auxiliary repair line ARL3 may be connected to the 3-3 auxiliary welding electrode AWE3-3. One end of the fourth auxiliary repair line ARL4 is separated from the 2-4 auxiliary welding electrode AWE2-4 with at least one insulating layer therebetween and the other end of the fourth auxiliary repair line ARL4 may be connected to the 3-4 auxiliary welding electrode AWE3-4.

Further referring to FIG. 10A, the 2-1 auxiliary welding electrode AWE2-1 which overlaps one end of the first auxiliary repair line ARL1, that is, the auxiliary overlapping unit AOV is formed on the same layer as the first electrode. That is, the 2-1 auxiliary welding electrode AWE2-1 is disposed on the overcoat layer OC. The 2-1 auxiliary welding electrode AWE2-1 may be a part branched from the first electrode of the 2-1 sub pixel PXL2-1. The auxiliary overlapping unit AOV of the first auxiliary repair line ARL1 and the 2-1 auxiliary welding electrode AWE2-1 are electrically separated from each other with at least one insulating layer interposed therebetween.

For example, a 1-1 auxiliary open hole AOH1-1 which exposes a part of the passivation layer PAS may be formed on the overcoat layer OC. In this case, at least a part of the 2-1 auxiliary welding electrode AWE2-1 is located on the passivation layer PAS in the 1-1 auxiliary open hole AOH1-1 which passes through the overcoat layer OC. An area where the 1-1 auxiliary open hole AOH1-1 is formed overlaps an area where laser is irradiated. According to the present disclosure, the overcoat layer OC having a predetermined thickness is removed in advance from an area where the welding process is performed so that the welding process may be easily performed without causing a process failure due to the thickness of the insulating layer. Even though it is not illustrated in the drawing, the 1-1 auxiliary open hole AOH1-1 may be formed to pass through the overcoat layer OC and the passivation layer PAS to expose a part of the interlayer insulating layer ILD.

Further referring to FIG. 10B, the 3-1 auxiliary welding electrode AWE3-1 which overlaps the other end of the first auxiliary repair line ARL1, that is, the auxiliary overlapping unit AOV is formed on the same layer as the first electrode. That is, the 3-1 auxiliary welding electrode AWE3-1 is disposed on the overcoat layer OC. The 3-1 auxiliary welding electrode AWE3-1 may be a part branched from the first electrode of the 3-1 sub pixel PXL3-1.

A 2-1 auxiliary open hole AOH2-1 which exposes the other end of the first auxiliary repair line ARL1, that is, a part of the auxiliary overlapping unit AOV may be formed in the overcoat layer OC, the passivation layer PAS, and the interlayer insulating layer ILD. The 2-1 auxiliary open hole AOH2-1 passes through the overcoat layer OC, the passivation layer PAS, and the interlayer insulating layer ILD. At least a part of the 3-1 auxiliary welding electrode AWE3-1 may be in direct contact with the auxiliary overlapping unit AOV of the first auxiliary repair line ARL1 through the 2-1 auxiliary open hole AOH2-1.

When a defective sub pixel PXL is detected during an inspection process, the separated auxiliary repair line ARL and a corresponding auxiliary welding electrode AWE are welded to be electrically connected. For example, when the 2-1 sub pixel PXL2-1 is determined as a defective sub pixel during the inspection process, a signal to be applied to the 2-1 sub pixel PXL2-1 is cut by the cutting process and one end of the first auxiliary repair line ARL1 and the 2-1 auxiliary welding electrode AWE2-1 which are separated are connected by the welding process.

As described above, according to the second aspect of the present disclosure, the repair between sub pixels PXL of pixels which form different pairs may be allowed using the auxiliary repair line ARL.

According to the second aspect of the present disclosure, repair not only between sub pixels PXL of pixels which form a pair, but also between sub pixels PXL of pixels which form different pairs may be allowed. The repair process may be selectively performed. That is, the repair process may be performed by selecting any one of a process using a repair line RL and a process using an auxiliary repair line ARL.

For example, when the 2-1 sub pixel PXL2-1 is determined as a defective sub pixel during the inspection process, the cutting process is performed to cut the signal to be applied to the 2-1 sub pixel PXL2-1. When the process using a repair line RL is selected, one end of the first repair line RL1 and the 1-1 welding electrode WE1-1 which are separated are connected by the welding process to electrically connect the first electrode of the 2-1 sub pixels PXL2-1 and the first electrode of the 1-1 sub pixel PXL1-1. In contrast, when the process using an auxiliary repair line ARL is selected, one end of the first auxiliary repair line ARL1 and the 2-1 auxiliary welding electrode AWE2-1 which are separated are connected by the welding process to electrically connect the first electrode of the 2-1 sub pixels PXL2-1 and the first electrode of the 3-1 sub pixel PXL3-1.

As described above, according to the second aspect of the present disclosure, unlike the first aspect, repair between sub pixels PXL of pixels which form different pairs is allowed. Therefore, even though all sub pixels PXL which emit light having the same color in the pixels which form one pair are defective, a quality of the corresponding sub pixels PXL may be improved. Accordingly, the second aspect of the present disclosure is advantageous to significantly improve a manufacturing yield of the display device.

In the second aspect of the present disclosure, the auxiliary connecting unit ALN of the auxiliary repair lines ARL is formed of a transparent conductive material. The auxiliary connecting unit ALN of the auxiliary repair line ARL may be formed of the same material on the same layer as the connecting unit LN of the repair line RL. The transparent conductive material may be any one of indium tin oxide (ITO), indium zinc oxide (IZO), and indium gallium zinc oxide (IGZO), but is not limited thereto. In the second aspect of the present disclosure, since the auxiliary repair line ARL has a predetermined transmittance, an area of the repair area RA where the repair line RL and the auxiliary repair line ARL are disposed may also be allocated to a transmission area TA. Therefore, according to the present disclosure, an area of the transmission area TA may be sufficiently ensured while ensuring a required area of the emission area EA regardless of the location of the repair line RL and the auxiliary repair line ARL so that a transparent display device with a good quality may be provided.

<Third Aspect>

Figure 11:
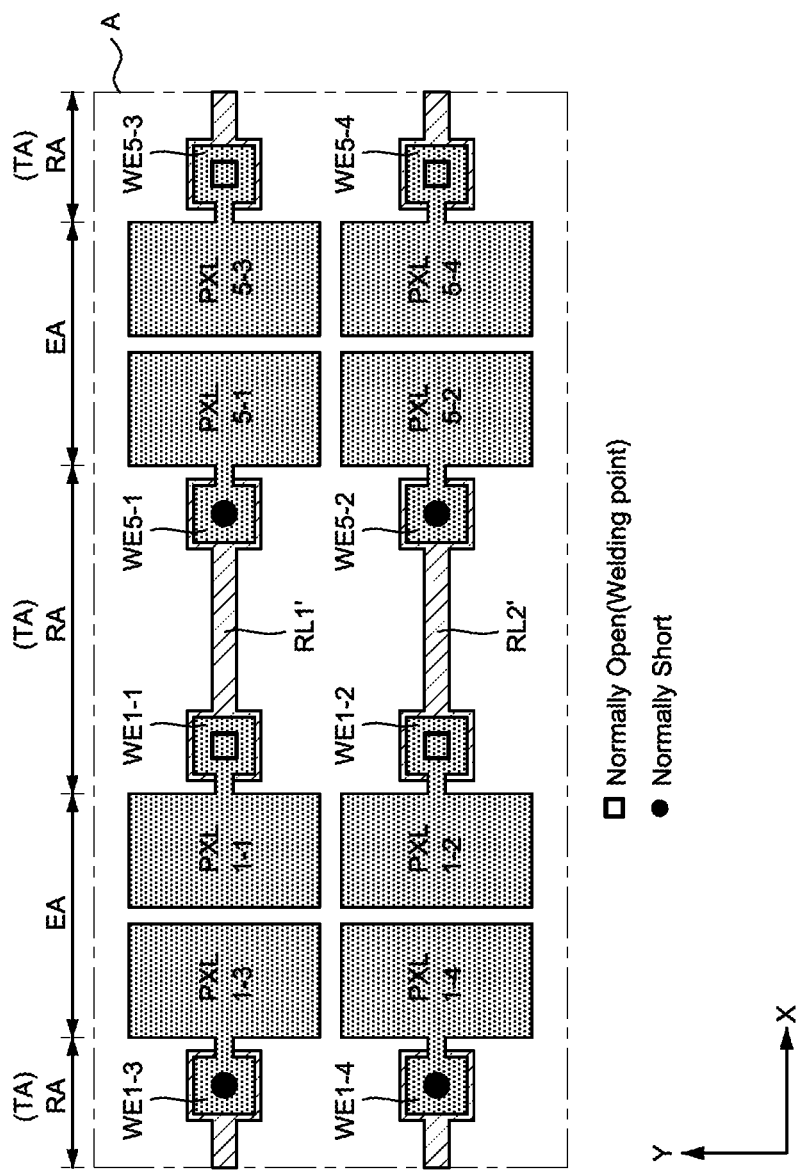
FIG. 11 is a plan view schematically illustrating part A of FIG. 1 of a third aspect of the present disclosure.

FIG. 11 is a plan view schematically illustrating a part A of FIG. 1 of a third aspect of the present disclosure. In the description of the third aspect of the present disclosure, a description of the configuration which is substantially the same as the first aspect may be omitted.

Referring to FIG. 11, a display device according to a third aspect of the present disclosure includes a display area including an emission area EA, a repair area RA, and a transmission area TA.

The emission area EA may be an area where light implementing an input image is actually emitted. The emission area EA includes sub pixels PXL having a transistor and an organic light emitting diode (or a light emitting diode). The transmission area TA may be an area where external light is transmitted to allow a user to recognize an object located on a rear surface of the display device.

The repair area RA may be an area where when a defect occurs in the sub pixel PXL, a repair process is performed. The repair area RA includes a repair structure having welding electrodes WE and a repair line RL'. Most of the repair area RA may be allocated to the transmission area TA, which will be described below.

The emission area EA includes pixels. The pixels may be disposed along a first direction (for example, a Y axis direction) and a second direction (for example, an X axis direction) which intersect each other. Pixels include sub pixels PXL. Sub pixels PXL may be disposed along the first direction and the second direction which intersect each other. The pixels include red R, green G, blue B, white W sub pixels PXL, but are not limited thereto. Hereinafter, for the convenience of description, a configuration in which the pixels include red R, green G, blue B, white W sub pixels PXL will be described as an example. Each of the sub pixels PXL includes a transistor disposed on a substrate and an organic light emitting diode electrically connected to the transistor.

To be more specific, the emission area EA includes a first pixel and a fifth pixel which are adjacent to each other in the second direction. The first pixel and the fifth pixel may be symmetrical to each other. That is, the first pixel and the fifth pixel may have a line symmetry relationship with respect to an imaginary axis traversing between the first pixel and the fifth pixel in the first direction.

The first pixel includes a 1-1 sub pixel PXL1-1, a 1-2 sub pixel PXL1-2, a 1-3 sub pixel PXL1-3, and a 1-4 sub pixel PXL1-4. Here, the 1-1 sub pixel PXL1-1 is a specific example of a first sub pixel of the first pixel. The 1-2 sub pixel PXL1-2 is a specific example of a second sub pixel of the first pixel. The 1-3 sub pixel PXL1-3 is a specific example of a third sub pixel of the first pixel. The 1-4 sub pixel PXL1-4 is a specific example of a fourth sub pixel of the first pixel. The fifth pixel includes a 5-1 sub pixel PXL5-1, a 5-2 sub pixel PXL5-2, a 5-3 sub pixel PXL5-3, and a 5-4 sub pixel PXL5-4. Here, the 5-1 sub pixel PXL5-1 is a specific example of a first sub pixel of the fifth pixel. The 5-2 sub pixel PXL5-2 is a specific example of a second sub pixel of the fifth pixel. The 5-3 sub pixel PXL5-3 is a specific example of a third sub pixel of the fifth pixel. The 5-4 sub pixel PXL5-4 is a specific example of a fourth sub pixel of the fifth pixel.

The 1-1 sub pixel PXL1-1 and the 5-1 sub pixel PXL5-1 emit light having the same first color. The 1-2 sub pixel PXL1-2 and the 5-2 sub pixel PXL5-2 emit light having the same second color. The 1-3 sub pixel PXL1-3 and the 5-3 sub pixel PXL5-3 emit light having the same third color. The 1-4 sub pixel PXL1-4 and the 5-4 sub pixel PXL5-4 emit light having the same fourth color. The first color, the second color, the third color, and the fourth color may be allocated as any one of red R, green G, blue B, and white W.

The sub pixels PXL disposed in one pixel may be disposed as a quad type as illustrated in the drawing.

The 1-1 sub pixel PXL1-1 and the 1-2 sub pixel PXL1-2 may be disposed to be adjacent to each other in the first direction. The 5-1 sub pixel PXL5-1 and the 5-2 sub pixel PXL5-2 may be disposed to be adjacent to each other in the first direction. The 1-3 sub pixel PXL1-3 and the 1-4 sub pixel PXL1-4 may be disposed to be adjacent to each other in the first direction. The 5-3 sub pixel PXL5-3 and the 5-4 sub pixel PXL5-4 may be disposed to be adjacent to each other in the first direction.

The 1-1 sub pixel PXL1-1 and the 1-3 sub pixel PXL1-3 may be disposed to be adjacent to each other in the second direction. The 1-2 sub pixel PXL1-2 and the 1-4 sub pixel PXL1-4 may be disposed to be adjacent to each other in the second direction. The 5-1 sub pixel PXL5-1 and the 5-3 sub pixel PXL5-3 may be disposed to be adjacent to each other in the second direction. The 5-2 sub pixel PXL5-2 and the 5-4 sub pixel PXL5-4 may be disposed to be adjacent to each other in the second direction.

The 1-3 sub pixel PXL1-3, the 1-1 sub pixel PXL1-1, the 5-1 sub pixel PXL5-1, and the 5-3 sub pixel PXL5-3 may be sequentially disposed along the second direction. Here, the first pixel and the fifth pixel have a symmetrical relationship so that the 1-1 sub pixel PXL1-1 of the first pixel and the 5-1 sub pixel PXL5-1 of the fifth pixel which are adjacent to each other in the second direction may emit light having the same color.

The 1-4 sub pixel PXL1-4, the 1-2 sub pixel PXL1-2, the 5-2 sub pixel PXL5-2, and the 5-4 sub pixel PXL5-4 may be sequentially disposed along the second direction. Here, the first pixel and the fifth pixel have a symmetrical relationship so that the 1-2 sub pixel PXL1-2 of the first pixel and the 5-2 sub pixel PXL5-2 of the fifth pixel which are adjacent to each other in the second direction may emit light having the same color.

The repair area RA includes a welding electrode WE and a repair line RL'.

The welding electrode WE is connected to a first electrode E1 of a corresponding sub pixel PXL. The welding electrode WE may be a part branched from a first electrode E1 of the sub pixel PXL. Since the welding electrodes WE are welded with the repair line RL' during a repair process, the welding electrodes are formed to have a predetermined area required for a process.

At least one welding electrode WE may be allocated for one sub pixel.

A 1-1 welding electrode WE1-1 is connected to a first electrode of the 1-1 sub pixel PXL1-1. A 1-2 welding electrode WE1-2 is connected to a first electrode of the 1-2 sub pixel PXL1-2. A 1-3 welding electrode WE1-3 is connected to a first electrode of the 1-3 sub pixel PXL1-3. A 1-4 welding electrode WE1-4 is connected to a first electrode of the 1-4 sub pixel PXL1-4.

A 5-1 welding electrode WE5-1 is connected to a first electrode of the 5-1 sub pixel PXL5-1. A 5-2 welding electrode WE5-2 is connected to a first electrode of the 5-2 sub pixel PXL5-2. A 5-3 welding electrode WE5-3 is connected to a first electrode of the 5-3 sub pixel PXL5-3. A 5-4 welding electrode WE5-4 is connected to a first electrode of the 5-4 sub pixel PXL5-4.

The repair line RL' may extend in the second direction. The repair line RL' which extends in the second direction may be referred to as a horizontal repair line RL'. One end and the other end of the repair line RL' are disposed to overlap welding electrodes WE of sub pixels PXL which emit the same color light. One end of a first' repair line RL1' overlaps the 1-1 welding electrode WE1-1 and the other end overlaps the 5-1 welding electrode WE5-1. One end of a second' repair line RL2' overlaps the 1-2 welding electrode WE1-2 and the other end overlaps the 5-2 welding electrode WE5-2. In the meantime, the first' repair line RL1' may be referred to as a first horizontal repair line. The second' repair line RL2' may be referred to as a second horizontal repair line.

Parts of one end and the other end of the repair line RL' which overlap the welding electrodes WE may be referred to as overlapping units OV. The overlapping unit OV overlaps the welding electrodes WE to be welded with the welding electrodes WE during the repair process so that the overlapping unit OV is formed to have a predetermined area required for the process. The welding electrodes WE and the overlapping unit OV may have the same area but are not limited thereto.

In the third aspect, any one of one end and the other end of the repair line RL' is connected to a corresponding welding electrode WE and the other one is not connected to the corresponding welding electrode WE. For example, one end of the first' repair line RL1' is separated from the 1-1 welding electrode WE1-1 with at least one insulating layer therebetween and the other end of the first' repair line RL1' is connected to the 5-1 welding electrode WE5-1. One end of the second' repair line RL2' is separated from the 1-2 welding electrode WE1-2 with at least one insulating layer therebetween and the other end of the second' repair line RL2' may be connected to the 5-2 welding electrode WE5-2. Hereinafter, for the convenience of description, only configuration illustrated in the drawing will be described as an example.

When a defective sub pixel PXL is detected during an inspection process, the repair line RL' and a corresponding welding electrode WE which are separated are welded to be electrically connected. For example, when it is determined that the 1-1 sub pixel PXL1-1 is defective during the inspection process, a signal to be applied to the 1-1 sub pixel PXL1-1 is cut by a cutting process and one end of the first' repair line RL1' and the 1-1 welding electrode WE1-1 which are separated are connected by the welding process. Therefore, the first electrode of the 1-1 sub pixel PXL1-1 and the first electrode of the 5-1 sub pixel PXL5-1 may be electrically connected.

The connecting unit LN of the repair lines RL' is formed of a transparent conductive material. The transparent conductive material may be any one of indium tin oxide (ITO), indium zinc oxide (IZO), and indium gallium zinc oxide (IGZO), but is not limited thereto. In the third aspect of the present disclosure, since the repair line RL' has a predetermined transmittance, an area of the repair area RA where the repair line RL' is disposed may also be allocated to a transmission area TA. Therefore, according to the present disclosure, an area of the transmission area TA may be sufficiently ensured while ensuring a required area of the emission area EA regardless of the location of the repair line RL' so that a transparent display device with a good quality may be provided.

<Fourth Aspect>

Figure 12:
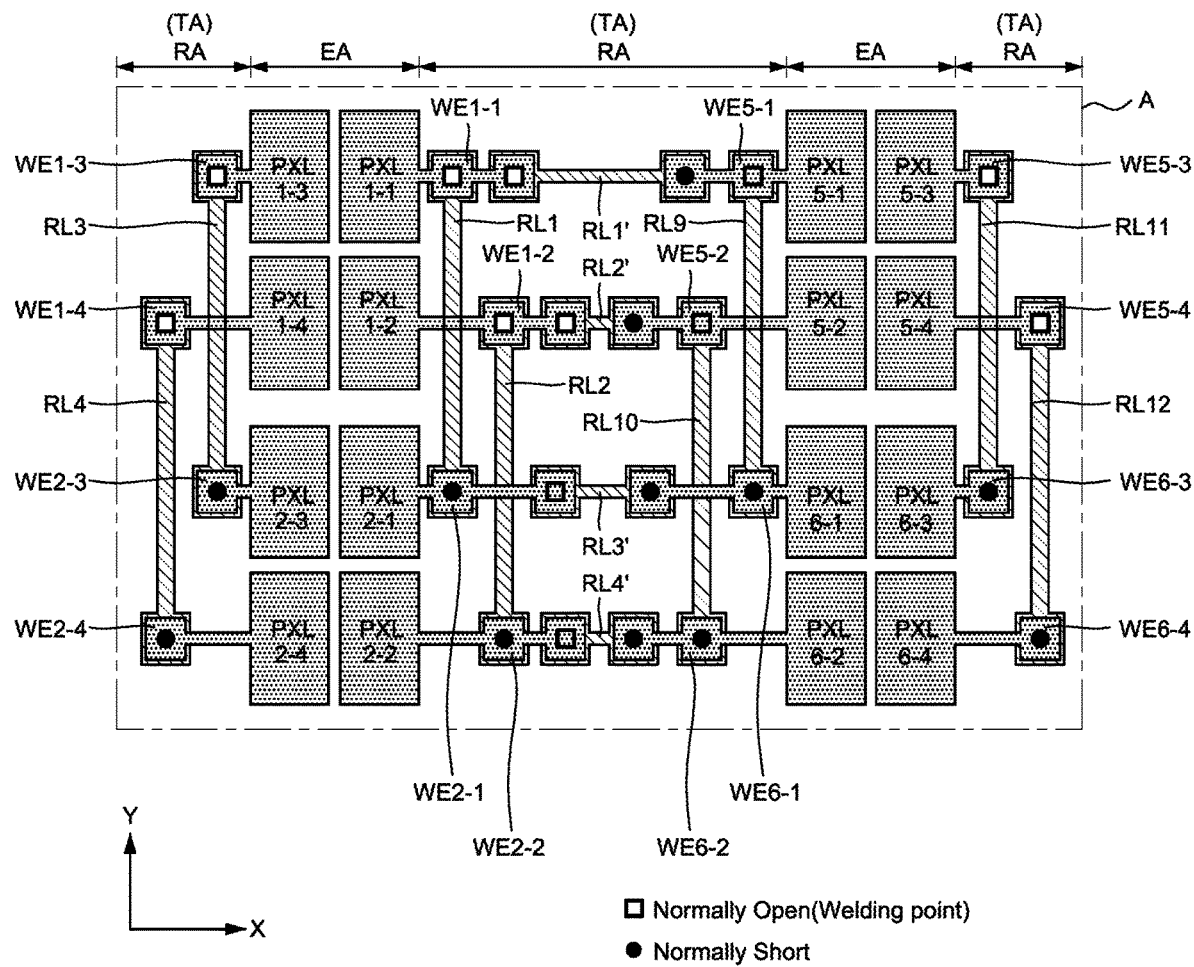
FIG. 12 is a plan view schematically illustrating part A of FIG. 1 of a fourth aspect of the present disclosure.

FIG. 12 is a plan view schematically illustrating a part A of FIG. 1 of a fourth aspect of the present disclosure. A fourth aspect of the present disclosure may be a structure in which a structure of the first aspect and a structure of the third aspect are combined. In the description of the fourth aspect of the present disclosure, a description of the configuration which is substantially the same as the first aspect and the third aspect may be omitted.

Referring to FIG. 12, a display device according to the fourth aspect of the present disclosure includes a display area including an emission area EA, a repair area RA, and a transmission area TA.

The emission area EA may be an area where light implementing an input image is actually emitted. The emission area EA includes sub pixels PXL having a transistor and an organic light emitting diode (or a light emitting diode). The transmission area TA may be an area where external light is transmitted to allow a user to recognize an object located on a rear surface of the display device.

The repair area RA may be an area where when a defect occurs in the sub pixel PXL, a repair process is performed. The repair area RA includes a repair structure having welding electrodes WE and repair lines RL and RL'. Most of the repair area RA may be allocated to the transmission area TA, which will be described below. For example, in the repair area RA, at least an area where the repair lines RL and RL' are disposed may be allocated to a transmission area TA. Therefore, the transmission area TA may be an entire area where elements of the emission area EA and the welding electrodes WE of the repair area RA are not disposed.

The emission area EA includes pixels. The pixels may be disposed along a first direction (for example, a Y axis direction) and a second direction (for example, an X axis direction) which intersect each other. Pixels include sub pixels PXL. Sub pixels PXL may be disposed along the first direction and the second direction which intersect each other. The pixels may include red R, green G, blue B, white W sub pixels PXL but are not limited thereto. Hereinafter, for the convenience of description, a configuration in which the pixels include red R, green G, blue B, white W sub pixels PXL will be described as an example. Each of the sub pixels PXL includes a transistor disposed on a substrate and an organic light emitting diode electrically connected to the transistor.

To be more specific, the emission area EA includes a first pixel, a second pixel, a fifth pixel, and a sixth pixel. The first pixel and the second pixel are disposed to be adjacent to each other in the first direction. The fifth pixel and the sixth pixel are disposed to be adjacent to each other in the first direction. The first pixel and the fifth pixel are disposed to be adjacent to each other in the second direction. The second pixel and the sixth pixel are disposed to be adjacent to each other in the second direction.

The first pixel and the fifth pixel may be symmetrical to each other. That is, the first pixel and the fifth pixel may have a line symmetry relationship with respect to an imaginary axis traversing between the first pixel and the fifth pixel in the first direction. The second pixel and the sixth pixel may be symmetrical to each other. That is, the second pixel and the sixth pixel may have a line symmetry relationship with respect to an imaginary axis traversing between the second pixel and the sixth pixel in the first direction.

The first pixel includes a 1-1 sub pixel PXL1-1, a 1-2 sub pixel PXL1-2, a 1-3 sub pixel PXL1-3, and a 1-4 sub pixel PXL1-4. Here, the 1-1 sub pixel PXL1-1 is a specific example of a first sub pixel of the first pixel. The 1-2 sub pixel PXL1-2 is a specific example of a second sub pixel of the first pixel. The 1-3 sub pixel PXL1-3 is a specific example of a third sub pixel of the first pixel. The 1-4 sub pixel PXL1-4 is a specific example of a fourth sub pixel of the first pixel. The second pixel includes a 2-1 sub pixel PXL2-1, a 2-2 sub pixel PXL2-2, a 2-3 sub pixel PXL2-3, and a 2-4 sub pixel PXL2-4. Here, the 2-1 sub pixel PXL2-1 is a specific example of a first sub pixel of the second pixel. The 2-2 sub pixel PXL2-2 is a specific example of a second sub pixel of the second pixel. The 2-3 sub pixel PXL2-3 is a specific example of a third sub pixel of the second pixel. The 2-4 sub pixel PXL2-4 is a specific example of a fourth sub pixel of the second pixel. The fifth pixel includes a 5-1 sub pixel PXL5-1, a 5-2 sub pixel PXL5-2, a 5-3 sub pixel PXL5-3, and a 5-4 sub pixel PXL5-4. Here, the 5-1 sub pixel PXL5-1 is a specific example of a first sub pixel of the fifth pixel. The 5-2 sub pixel PXL5-2 is a specific example of a second sub pixel of the fifth pixel. The 5-3 sub pixel PXL5-3 is a specific example of a third sub pixel of the fifth pixel. The 5-4 sub pixel PXL5-4 is a specific example of a fourth sub pixel of the fifth pixel. The sixth pixel includes a 6-1 sub pixel PXL6-1, a 6-2 sub pixel PXL6-2, a 6-3 sub pixel PXL6-3, and a 6-4 sub pixel PXL6-4. Here, the 6-1 sub pixel PXL6-1 is a specific example of a first sub pixel of the sixth pixel. The 6-2 sub pixel PXL6-2 is a specific example of a second sub pixel of the sixth pixel. The 6-3 sub pixel PXL6-3 is a specific example of a third sub pixel of the sixth pixel. The 6-4 sub pixel PXL6-4 is a specific example of a fourth sub pixel of the sixth pixel.

The 1-1 sub pixel PXL1-1, the 2-1 sub pixel PXL2-1, the 5-1 sub pixel PXL5-1, and the 6-1 sub pixel PXL6-1 emit light having the same first color. The 1-2 sub pixel PXL1-2, the 2-2 sub pixel PXL2-2, the 5-2 sub pixel PXL5-2, and the 6-2 sub pixel PXL6-2 emit light having the same second color. The 1-3 sub pixel PXL1-3, the 2-3 sub pixel PXL2-3, the 5-3 sub pixel PXL5-3, and the 6-3 sub pixel PXL6-3 emit light having the same third color. The 1-4 sub pixel PXL1-4, the 2-4 sub pixel PXL2-4, the 5-4 sub pixel PXL5-4, and the 6-4 sub pixel PXL6-4 emit light having the same fourth color. The first color, the second color, the third color, and the fourth color may be allocated as any one of red R, green G, blue B, and white W.

The sub pixels PXL disposed in one pixel may be disposed as a quad type as illustrated in the drawing.

The 1-1 sub pixel PXL1-1, the 1-2 sub pixel PXL1-2, the 2-1 sub pixel PXL2-1, and the 2-2 sub pixel PXL2-2 may be sequentially disposed along the first direction. The 1-3 sub pixel PXL1-3, the 1-4 sub pixel PXL1-4, the 2-3 sub pixel PXL2-3, and the 2-4 sub pixel PXL2-4 may be sequentially disposed along the first direction. The 5-1 sub pixel PXL5-1, the 5-2 sub pixel PXL5-2, the 6-1 sub pixel PXL6-1, and the 6-2 sub pixel PXL6-2 may be sequentially disposed along the first direction. The 5-3 sub pixel PXL5-3, the 5-4 sub pixel PXL5-4, the 6-3 sub pixel PXL6-3, and the 6-4 sub pixel PXL6-4 may be sequentially disposed along the first direction.

The 1-1 sub pixel PXL1-1 and the 1-3 sub pixel PXL1-3 may be disposed to be adjacent to each other in the second direction. The 1-2 sub pixel PXL1-2 and the 1-4 sub pixel PXL1-4 may be disposed to be adjacent to each other in the second direction. The 5-1 sub pixel PXL5-1 and the 5-3 sub pixel PXL5-3 may be disposed to be adjacent to each other in the second direction. The 5-2 sub pixel PXL5-2 and the 5-4 sub pixel PXL5-4 may be disposed to be adjacent to each other in the second direction.

The 2-1 sub pixel PXL2-1 and the 2-3 sub pixel PXL2-3 may be disposed to be adjacent to each other in the second direction. The 2-2 sub pixel PXL2-2 and the 2-4 sub pixel PXL2-4 may be disposed to be adjacent to each other in the second direction. The 6-1 sub pixel PXL6-1 and the 6-3 sub pixel PXL6-3 may be disposed to be adjacent to each other in the second direction. The 6-2 sub pixel PXL6-2 and the 6-4 sub pixel PXL6-4 may be disposed to be adjacent to each other in the second direction.

The 1-3 sub pixel PXL1-3, the 1-1 sub pixel PXL1-1, the 5-1 sub pixel PXL5-1, and the 5-3 sub pixel PXL5-3 may be sequentially disposed along the second direction. Here, the first pixel and the fifth pixel have a symmetrical relationship so that the 1-1 sub pixel PXL1-1 of the first pixel and the 5-1 sub pixel PXL5-1 of the fifth pixel which are adjacent to each other in the second direction may emit light having the same color.

The 1-4 sub pixel PXL1-4, the 1-2 sub pixel PXL1-2, the 5-2 sub pixel PXL5-2, and the 5-4 sub pixel PXL5-4 may be sequentially disposed along the second direction. Here, the first pixel and the fifth pixel have a symmetrical relationship so that the 1-2 sub pixel PXL1-2 of the first pixel and the 5-2 sub pixel PXL5-2 of the fifth pixel which are adjacent to each other in the second direction may emit light having the same color.

The 2-3 sub pixel PXL2-3, the 2-1 sub pixel PXL2-1, the 6-1 sub pixel PXL6-1, and the 6-3 sub pixel PXL6-3 may be sequentially disposed along the second direction. Here, the second pixel and the sixth pixel have a symmetrical relationship so that the 2-1 sub pixel PXL2-1 of the second pixel and the 6-1 sub pixel PXL6-1 of the sixth pixel which are adjacent to each other in the second direction may emit light having the same color.

The 2-4 sub pixel PXL2-4, the 2-2 sub pixel PXL2-2, the 6-2 sub pixel PXL6-2, and the 6-4 sub pixel PXL6-4 may be sequentially disposed along the second direction. Here, the second pixel and the sixth pixel have a symmetrical relationship so that the 2-2 sub pixel PXL2-2 of the second pixel and the 6-2 sub pixel PXL6-2 of the sixth pixel which are adjacent to each other in the second direction may emit light having the same color.

The repair area RA includes welding electrodes WE and repair lines RL and RL'.

The welding electrode WE is connected to a first electrode E1 of a corresponding sub pixel PXL. The welding electrode WE may be a part branched from the first electrode E1 of the sub pixel PXL. Since the welding electrodes WE are welded with the repair lines RL and RL' during a repair process, the welding electrodes are formed to have a predetermined area required for a process.

At least one welding electrode WE may be allocated for one sub pixel.

A 1-1 welding electrode WE1-1 is connected to a first electrode of the 1-1 sub pixel PXL1-1. A 1-2 welding electrode WE1-2 is connected to a first electrode of the 1-2 sub pixel PXL1-2. A 1-3 welding electrode WE1-3 is connected to a first electrode of the 1-3 sub pixel PXL1-3. A 1-4 welding electrode WE1-4 is connected to a first electrode of the 1-4 sub pixel PXL1-4.

A 5-1 welding electrode WE5-1 is connected to a first electrode of the 5-1 sub pixel PXL5-1. A 5-2 welding electrode WE5-2 is connected to a first electrode of the 5-2 sub pixel PXL5-2. A 5-3 welding electrode WE5-3 is connected to a first electrode of the 5-3 sub pixel PXL5-3. A 5-4 welding electrode WE5-4 is connected to a first electrode of the 5-4 sub pixel PXL5-4.

A 2-1 welding electrode WE2-1 is connected to a first electrode of the 2-1 sub pixel PXL2-1. A 2-2 welding electrode WE2-2 is connected to a first electrode of the 2-2 sub pixel PXL2-2. A 2-3 welding electrode WE2-3 is connected to a first electrode of the 2-3 sub pixel PXL2-3. A 2-4 welding electrode WE2-4 is connected to a first electrode of the 2-4 sub pixel PXL2-4.

A 6-1 welding electrode WE6-1 is connected to a first electrode of the 6-1 sub pixel PXL6-1. A 6-2 welding electrode WE6-2 is connected to a first electrode of the 6-2 sub pixel PXL6-2. A 6-3 welding electrode WE6-3 is connected to a first electrode of the 6-3 sub pixel PXL6-3. A 6-4 welding electrode WE6-4 is connected to a first electrode of the 6-4 sub pixel PXL6-4.

The repair lines RL and RL' may extend in the first direction and the second direction. One end and the other end of the repair lines RL and RL' are disposed to overlap welding electrodes WE of sub pixels PXL which emit the same color light. The repair line RL which extends in the first direction may be referred to as a vertical repair line RL. The repair line RL' which extends in the second direction may be referred to as a horizontal repair line RL'.

One end of the first repair line RL1 overlaps the 1-1 welding electrode WE1-1 and the other end overlaps the 2-1 welding electrode WE2-1. One end of the second repair line RL2 overlaps the 1-2 welding electrode WE1-2 and the other end overlaps the 2-2 welding electrode WE2-2. One end of a third repair line RL3 overlaps the 1-3 welding electrode WE1-3 and the other end overlaps the 2-3 welding electrode WE2-3. One end of a fourth repair line RL4 overlaps the 1-4 welding electrode WE1-4 and the other end overlaps the 2-4 welding electrode WE2-4. In the meantime, the first repair line RL1 may be referred to as a first vertical repair line. The second repair line RL2 may be referred to as a second vertical repair line. The third repair line RL3 may be referred to as a third vertical repair line. The fourth repair line RL4 may be referred to as a fourth vertical repair line.

One end of a ninth repair line RL9 overlaps the 5-1 welding electrode WE5-1 and the other end overlaps the 6-1 welding electrode WE6-1. One end of a tenth repair line RL10 overlaps the 5-2 welding electrode WE5-2 and the other end overlaps the 6-2 welding electrode WE6-2. One end of an eleventh repair line RL11 overlaps the 5-3 welding electrode WE5-3 and the other end overlaps the 6-3 welding electrode WE6-3. One end of a twelfth repair line RL12 overlaps the 5-4 welding electrode WE5-4 and the other end overlaps the 6-4 welding electrode WE6-4. In the meantime, the ninth repair line RL9 may be referred to as a ninth vertical repair line. The tenth repair line RL10 may be referred to as a tenth vertical repair line. The eleventh repair line RL11 may be referred to as a eleventh vertical repair line. The twelfth repair line RL12 may be referred to as a twelfth vertical repair line.

One end of a first' repair line RL1' overlaps the 1-1 welding electrode WE1-1 and the other end overlaps the 5-1 welding electrode WE5-1. One end of a second' repair line RL2' overlaps the 1-2 welding electrode WE1-2 and the other end overlaps the 5-2 welding electrode WE5-2. In the meantime, the first' repair line RL1' may be referred to as a first horizontal repair line. The second' repair line RL2' may be referred to as a second horizontal repair line.

One end of a third' repair line RL3' overlaps the 2-1 welding electrode WE2-1 and the other end overlaps the 6-1 welding electrode WE6-1. One end of a fourth' repair line RL4' overlaps the 2-2 welding electrode WE2-2 and the other end overlaps the 6-2 welding electrode WE6-2. In the meantime, the third' repair line RL3' may be referred to as a third horizontal repair line. The fourth' repair line RL4' may be referred to as a fourth horizontal repair line.

Parts of one end and the other end of the repair lines RL and RL' which overlap the welding electrodes WE may be referred to as overlapping units OV. The overlapping unit OV overlaps the welding electrodes WE to be welded with the welding electrodes WE during the repair process so that the overlapping unit OV is formed to have a predetermined area required for the process. The welding electrodes WE and the overlapping unit OV may have the same area, but are not limited thereto.

In the fourth aspect, any one of one end and the other end of the repair lines RL and RL' is connected to a corresponding welding electrode WE and the other one is not connected to the corresponding welding electrode WE.

For example, as illustrated in the drawing, one end of the first repair line RL1 is separated from the 1-1 welding electrode WE1-1 with at least one insulating layer therebetween and the other end of the first repair line RL1 may be connected to the 2-1 welding electrode WE2-1. One end of the second repair line RL2 is separated from the 1-2 welding electrode WE1-2 with at least one insulating layer therebetween and the other end of the second repair line RL2 may be connected to the 2-2 welding electrode WE2-2. One end of the third repair line RL3 is separated from the 1-3 welding electrode WE1-3 with at least one insulating layer therebetween and the other end of the third repair line RL3 may be connected to the 2-3 welding electrode WE2-3. One end of the fourth repair line RL4 is separated from the 1-4 welding electrode WE1-4 with at least one insulating layer therebetween and the other end of the fourth repair line RL4 may be connected to the 2-4 welding electrode WE2-4.

One end of the ninth repair line RL9 is separated from the 5-1 welding electrode WE5-1 with at least one insulating layer therebetween and the other end of the ninth repair line RL9 may be connected to the 6-1 welding electrode WE6-1. One end of the tenth repair line RL10 is separated from the 5-2 welding electrode WE5-2 with at least one insulating layer therebetween and the other end of the tenth repair line RL10 may be connected to the 6-2 welding electrode WE6-2. One end of the eleventh repair line RL11 is separated from the 5-3 welding electrode WE5-3 with at least one insulating layer therebetween and the other end of the eleventh repair line RL11 may be connected to the 6-3 welding electrode WE6-3. One end of the twelfth repair line RL12 is separated from the 5-4 welding electrode WE5-4 with at least one insulating layer therebetween and the other end of the twelfth repair line RL12 may be connected to the 6-4 welding electrode WE6-4.

One end of the first' repair line RL1' is separated from the 1-1 welding electrode WE1-1 with at least one insulating layer therebetween and the other end of the first' repair line RL1' is connected to the 5-1 welding electrode WE5-1. One end of the second' repair line RL2' is separated from the 1-2 welding electrode WE1-2 with at least one insulating layer therebetween and the other end of the second' repair line RL2' is connected to the 5-2 welding electrode WE5-2.

One end of the third' repair line RL3' is separated from the 2-1 welding electrode WE2-1 with at least one insulating layer therebetween and the other end of the third' repair line RL3' may be connected to the 6-1 welding electrode WE6-1. One end of the fourth' repair line RL4' is separated from the 2-2 welding electrode WE2-2 with at least one insulating layer therebetween and the other end of the fourth' repair line RL4' may be connected to the 6-2 welding electrode WE6-2.

In one area, the vertical repair line RL which extends in the first direction and the horizontal repair line RL' which extends in the second direction may be connected to each other. For example, in an area where the 6-2 welding electrode WE6-2 is located, the other end of the tenth repair line RL10 and the other end of the fourth' repair line RL4' may be connected to each other and may be connected to the 6-2 welding electrode WE6-2 through one contact point.

When a defective sub pixel PXL is detected during an inspection process, the repair line RL or RL' and a corresponding welding electrode WE which are separated are welded to be electrically connected.

For example, when it is determined that the 1-1 sub pixel PXL1-1 is defective during the inspection process, a signal to be applied to the 1-1 sub pixel PXL1-1 is cut by a cutting process and one end of the first repair line RL1 and the 1-1 welding electrode WE1-1 which are separated are connected by the welding process. Therefore, the first electrode of the 1-1 sub pixel PXL1-1 and the first electrode of the 2-1 sub pixel PXL2-1 may be electrically connected. Alternatively, a signal to be applied to the 1-1 sub pixel PXL1-1 is cut by a cutting process and one end of the first' repair line RL1' and the 1-1 welding electrode WE1-1 which are separated are connected by the welding process. Therefore, the first electrode of the 1-1 sub pixel PXL1-1 and the first electrode of the 5-1 sub pixel PXL5-1 may be electrically connected.

As described above, according to the fourth aspect of the present disclosure, sub pixels PXL of pixels adjacent in the first direction may be selectively repaired. Accordingly, the fourth aspect of the present disclosure is advantageous to significantly improve a manufacturing yield of the display device.

A connecting unit LN of the repair lines RL and RL' is formed of a transparent conductive material. The transparent conductive material may be any one of indium tin oxide (ITO), indium zinc oxide (IZO), and indium gallium zinc oxide (IGZO), but is not limited thereto. In the fourth aspect of the present disclosure, since the repair lines RL and RL' have a predetermined transmittance, an area of the repair area RA where the repair line RL or RL' is disposed may also be allocated to a transmission area TA. Therefore, according to the present disclosure, an area of the transmission area TA may be sufficiently ensured while ensuring a required area of the emission area EA regardless of the location of the repair line RL or RL' so that a transparent display device with a good quality may be provided.

<Fifth Aspect>

Figure 13:
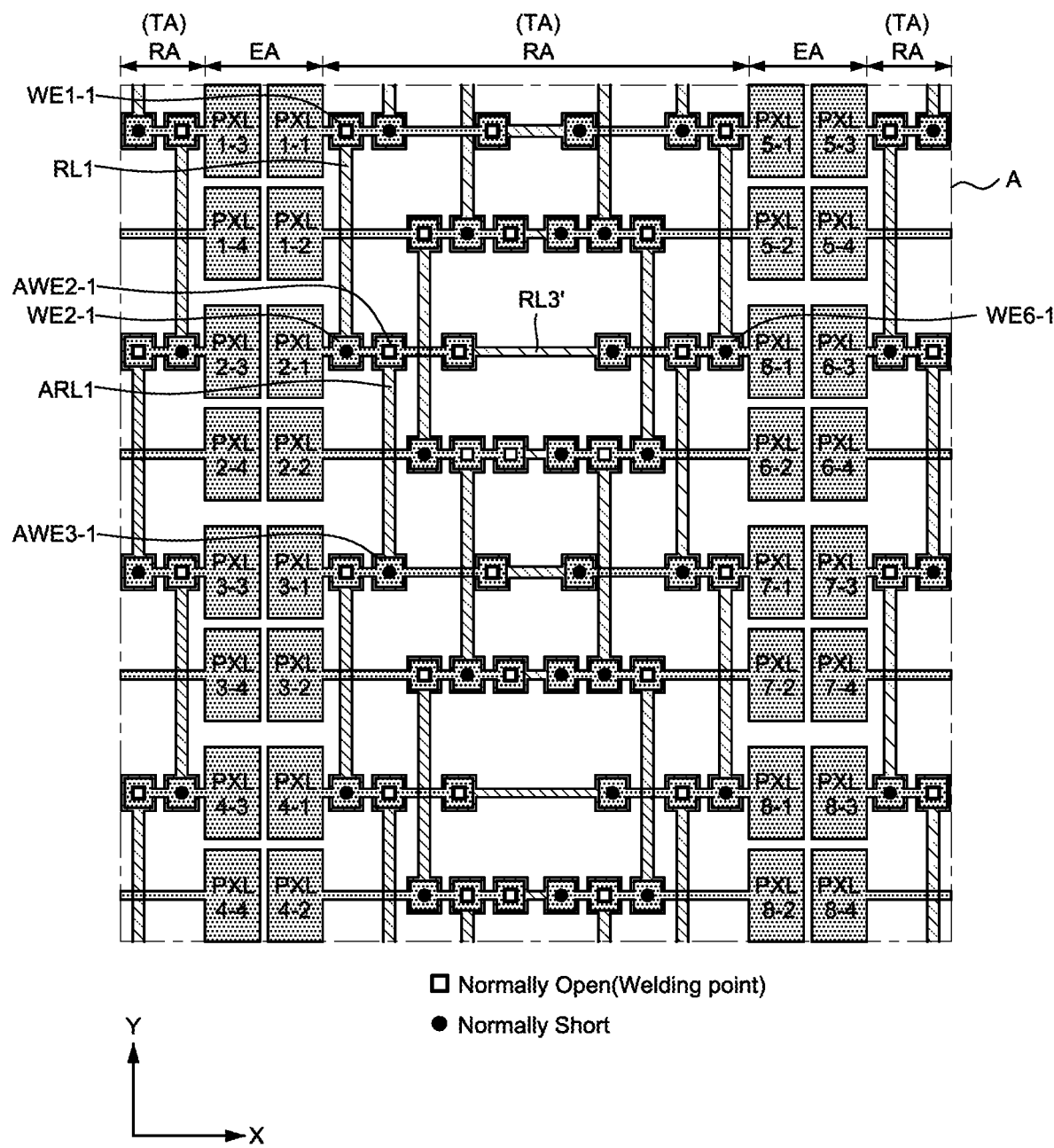
FIG. 13 is a plan view schematically illustrating part A of FIG. 1 of a fifth aspect of the present disclosure.

FIG. 13 is a plan view schematically illustrating a part A of FIG. 1 of a fifth aspect of the present disclosure. A fifth aspect of the present disclosure may be a structure in which a structure of the second aspect and a structure of the fourth aspect are combined. In the description of the fifth aspect of the present disclosure, a description of the configuration which is substantially the same as the second aspect and the fourth aspect may be omitted.

Referring to FIG. 13, a display device according to a fifth aspect of the present disclosure includes a display area including an emission area EA, a repair area RA, and a transmission area TA.

The emission area EA may be an area where light implementing an input image is actually emitted. The emission area EA includes sub pixels PXL having a transistor and an organic light emitting diode (or a light emitting diode). The transmission area TA may be an area where external light is transmitted to allow a user to recognize an object located on a rear surface of the display device.

The repair area RA may be an area where when a defect occurs in the sub pixel PXL, a repair process is performed. The repair area RA includes a repair structure having welding electrodes WE and repair lines RL and RL'. Most of the repair area RA may be allocated to the transmission area TA, which will be described below. For example, in the repair area RA, at least an area where the repair lines RL and RL' are disposed may be allocated to a transmission area TA. Therefore, the transmission area TA may be an entire area where elements of the emission area EA and the welding electrodes WE of the repair area RA are not disposed.

The emission area EA includes pixels. The pixels may be disposed along a first direction (for example, a Y axis direction) and a second direction (for example, an X axis direction) which intersect each other. Pixels include sub pixels PXL. Sub pixels PXL may be disposed along the first direction and the second direction which intersect each other. The pixels may include red R, green G, blue B, white W sub pixels PXL, but are not limited thereto. Hereinafter, for the convenience of description, a configuration in which the pixels include red R, green G, blue B, white W sub pixels PXL will be described as an example. Each of the sub pixels PXL includes a transistor disposed on a substrate and an organic light emitting diode electrically connected to the transistor.

To be more specific, the emission area EA includes a first pixel, a second pixel, a third pixel, a fourth pixel, a fifth pixel, a sixth pixel, a seventh pixel, and an eighth pixel. The first pixel, the second pixel, the third pixel, and the fourth pixel may be sequentially disposed along the first direction. The fifth pixel, the sixth pixel, the seventh pixel, and the eighth pixel may be sequentially disposed along the first direction.

Two pixels adjacent in the first direction may form a pair. That is, the first pixel and the second pixel form a first pair and the third pixel and the fourth pixel form a second pair. Further, the fifth pixel and the sixth pixel form a third pair and the seventh pixel and the eighth pixel form a fourth pair.

The first pixel and the fifth pixel are disposed to be adjacent to each other in the second direction. The second pixel and the sixth pixel are disposed to be adjacent to each other in the second direction. The third pixel and the seventh pixel are disposed to be adjacent to each other in the second direction. The fourth pixel and the eighth pixel are disposed to be adjacent to each other in the second direction.

The first pixel and the fifth pixel may be symmetrical to each other. That is, the first pixel and the fifth pixel may have a line symmetry relationship with respect to an imaginary axis traversing between the first pixel and the fifth pixel in the first direction. The second pixel and the sixth pixel may be symmetrical to each other. That is, the second pixel and the sixth pixel may have a line symmetry relationship with respect to an imaginary axis traversing between the second pixel and the sixth pixel in the first direction. The third pixel and the seventh pixel may be symmetrical to each other. That is, the third pixel and the seventh pixel may have a line symmetry relationship with respect to an imaginary axis traversing between the third pixel and the seventh pixel in the first direction. The fourth pixel and the eighth pixel may be symmetrical to each other. That is, the fourth pixel and the eighth pixel may have a line symmetry relationship with respect to an imaginary axis traversing between the fourth pixel and the eighth pixel in the first direction.

The first pixel includes a 1-1 sub pixel PXL1-1, a 1-2 sub pixel PXL1-2, a 1-3 sub pixel PXL1-3, and a 1-4 sub pixel PXL1-4. Here, the 1-1 sub pixel PXL1-1 is a specific example of a first sub pixel of the first pixel. The 1-2 sub pixel PXL1-2 is a specific example of a second sub pixel of the first pixel. The 1-3 sub pixel PXL1-3 is a specific example of a third sub pixel of the first pixel. The 1-4 sub pixel PXL1-4 is a specific example of a fourth sub pixel of the first pixel. The second pixel includes a 2-1 sub pixel PXL2-1, a 2-2 sub pixel PXL2-2, a 2-3 sub pixel PXL2-3, and a 2-4 sub pixel PXL2-4. Here, the 2-1 sub pixel PXL2-1 is a specific example of a first sub pixel of the second pixel. The 2-2 sub pixel PXL2-2 is a specific example of a second sub pixel of the second pixel. The 2-3 sub pixel PXL2-3 is a specific example of a third sub pixel of the second pixel. The 2-4 sub pixel PXL2-4 is a specific example of a fourth sub pixel of the second pixel.

The fifth pixel includes a 5-1 sub pixel PXL5-1, a 5-2 sub pixel PXL5-2, a 5-3 sub pixel PXL5-3, and a 5-4 sub pixel PXL5-4. Here, the 5-1 sub pixel PXL5-1 is a specific example of a first sub pixel of the fifth pixel. The 5-2 sub pixel PXL5-2 is a specific example of a second sub pixel of the fifth pixel. The 5-3 sub pixel PXL5-3 is a specific example of a third sub pixel of the fifth pixel. The 5-4 sub pixel PXL5-4 is a specific example of a fourth sub pixel of the fifth pixel. The sixth pixel includes a 6-1 sub pixel PXL6-1, a 6-2 sub pixel PXL6-2, a 6-3 sub pixel PXL6-3, and a 6-4 sub pixel PXL6-4. Here, the 6-1 sub pixel PXL6-1 is a specific example of a first sub pixel of the sixth pixel. The 6-2 sub pixel PXL6-2 is a specific example of a second sub pixel of the sixth pixel. The 6-3 sub pixel PXL6-3 is a specific example of a third sub pixel of the sixth pixel. The 6-4 sub pixel PXL6-4 is a specific example of a fourth sub pixel of the sixth pixel.

The 1-1 sub pixel PXL1-1, the 2-1 sub pixel PXL2-1, the 5-1 sub pixel PXL5-1, and the 6-1 sub pixel PXL6-1 emit light having the same first color. The 1-2 sub pixel PXL1-2, the 2-2 sub pixel PXL2-2, the 5-2 sub pixel PXL5-2, and the 6-2 sub pixel PXL6-2 emit light having the same second color. The 1-3 sub pixel PXL1-3, the 2-3 sub pixel PXL2-3, the 5-3 sub pixel PXL5-3, and the 6-3 sub pixel PXL6-3 emit light having the same third color. The 1-4 sub pixel PXL1-4, the 2-4 sub pixel PXL2-4, the 5-4 sub pixel PXL5-4, and the 6-4 sub pixel PXL6-4 emit light having the same fourth color. The first color, the second color, the third color, and the fourth color may be allocated as any one of red R, green G, blue B, and white W.

The sub pixels PXL disposed in one pixel may be disposed as a quad type as illustrated in the drawing. An arrangement of sub pixels PXL in each pixel may correspond to a combined structure of the second aspect and the fourth aspect as illustrated in the drawing. Accordingly, a detailed description thereof will be omitted.

Hereinafter, only repair structures of the 1-1 sub pixel PXL1-1 of the first pixel, the 2-1 sub pixel PXL2-1 of the second pixel, the 3-1 sub pixel PXL3-1 of the third pixel, and the 6-1 sub pixel PXL6-1 of the sixth pixel will be described as an example. The 1-1 sub pixel PXL1-1 of the first pixel, the 2-1 sub pixel PXL2-1 of the second pixel, the 3-1 sub pixel PXL3-1 of the third pixel, and the 6-1 sub pixel PXL6-1 of the sixth pixel are sub pixels PXL which emit light having the same color.

The repair area RA includes welding electrodes WE, repair lines RL and RL', an auxiliary welding electrode AWE, and an auxiliary repair line ARL.

The welding electrode WE is connected to the first electrode E1 of a corresponding sub pixel PXL. The welding electrodes WE may be parts branched from the first electrode E1 of the sub pixel PXL.

For example, a 1-1 welding electrode WE1-1 is connected to a first electrode of the 1-1 sub pixel PXL1-1. A 2-1 welding electrode WE2-1 is connected to a first electrode of the 2-1 sub pixel PXL2-1.

The repair lines RL and RL' may extend in the first direction and the second direction. One end and the other end of the repair lines RL and RL' are disposed to overlap welding electrodes WE of sub pixels PXL which emit the same color light. The repair line RL which extends in the first direction may be referred to as a vertical repair line RL. The repair line RL' which extends in the second direction may be referred to as a horizontal repair line RL'.

The vertical repair line RL may be used to repair between sub pixels PXL of pixels which form a pair, among pixels adjacent to each other in the first direction. To this end, one end of the first repair line RL1 may be disposed to overlap the 1-1 welding electrode WE1-1 and the other end overlaps the 2-1 welding electrode WE2-1.

Any one of one end and the other end of the vertical repair line RL is connected to a corresponding welding electrode WE and the other one is not connected to the corresponding welding electrode WE. For example, one end of a first repair line RL1 is separated from the 1-1 welding electrode WE1-1 with at least one insulating layer therebetween and the other end of the first repair line RL1 is connected to the 2-1 welding electrode WE2-1.

The horizontal repair line RL' may be used to repair between sub pixels PXL of pixels which are adjacent to each other in the second direction. To this end, one end of a third' repair line RL3' may be disposed to overlap the 2-1 welding electrode WE2-1 and the other end overlaps the 6-1 welding electrode WE6-1.

Any one of one end and the other end of the horizontal repair line RL' is connected to a corresponding welding electrode WE and the other one is not connected to the corresponding welding electrode WE. For example, one end of a third' repair line RL3' is separated from the 2-1 welding electrode WE2-1 with at least one insulating layer therebetween and the other end of the third' repair line RL3' is connected to the 6-1 welding electrode WE6-1.

The auxiliary welding electrode AWE is connected to a first electrode of a corresponding sub pixel PXL. The auxiliary welding electrode AWE may be a part branched from the first electrode of the sub pixel PXL. The auxiliary welding electrode AWE may be a part branched from a welding electrode WE connected to the first electrode of the sub pixel PXL.

At least one auxiliary welding electrode AWE may be allocated for one sub pixel. For example, a 2-1 auxiliary welding electrode AWE2-1 is connected to a first electrode of the 2-1 sub pixel PXL2-1. A 3-1 auxiliary welding electrode AWE3-1 is connected to a first electrode of the 3-1 sub pixel PXL3-1.

The auxiliary repair line ARL may extend in the first direction. The auxiliary repair line ARL may be used to repair between sub pixels PXL of pixels which form different pairs, among pixels adjacent to each other in the first direction. To this end, one end of the first auxiliary repair line ARL1 overlaps the 2-1 auxiliary welding electrode AWE2-1 and the other end overlaps the 3-1 auxiliary welding electrode AWE3-1.

Any one of one end and the other end of the auxiliary repair line ARL is connected to a corresponding auxiliary welding electrode AWE and the other one is not connected to the corresponding auxiliary welding electrode AWE. For example, one end of a first auxiliary repair line ARL1 is separated from the 2-1 auxiliary welding electrode AWE2-1 with at least one insulating layer therebetween and the other end of the first auxiliary repair line ARL1 is connected to the 3-1 auxiliary welding electrode AWE3-1.

The repair process may be selectively performed as follows.

For example, when it is determined that the 2-1 sub pixel PXL2-1 is defective during the inspection process, a signal to be applied to the 2-1 sub pixel PXL2-1 is cut by a cutting process and one end of the first repair line RL1 and the 1-1 welding electrode WE1-1 which are separated are connected by the welding process. Therefore, the first electrode of the 1-1 sub pixel PXL1-1 and the first electrode of the 2-1 sub pixel PXL2-1 may be electrically connected.

Alternatively, a signal to be applied to the 2-1 sub pixel PXL2-1 is cut by a cutting process and one end of the third' repair line RL3' and the 2-1 welding electrode WE2-1 which are separated are connected by the welding process. Therefore, the first electrode of the 2-1 sub pixel PXL2-1 and the first electrode of the 6-1 sub pixel PXL6-1 may be electrically connected.

Alternatively, a signal to be applied to the 2-1 sub pixel PXL2-1 is cut by a cutting process and one end of the first auxiliary repair line ARL1 and the 2-1 auxiliary welding electrode AWE2-1 which are separated are connected by the welding process. Therefore, the first electrode of the 2-1 sub pixel PXL2-1 and the first electrode of the 3-1 sub pixel PXL3-1 may be electrically connected.

As described above, according to the fifth aspect of the present disclosure, the repair may be selectively performed between pixels which form one pair among pixels adjacent to each other in the first direction, between pixels which form different pairs among pixels adjacent to each other in the first direction, and between pixels adjacent to each other in the second direction. Accordingly, the fifth aspect of the present disclosure is advantageous to significantly improve a manufacturing yield of the display device.

The connecting unit LN of the repair lines RL and RL' and the auxiliary connecting unit ALN of the auxiliary repair lines ARL are formed of a transparent conductive material. The transparent conductive material may be any one of indium tin oxide (ITO), indium zinc oxide (IZO), and indium gallium zinc oxide (IGZO), but is not limited thereto. In the fifth aspect of the present disclosure, since the repair lines RL and RL' have a predetermined transmittance, an area of the repair area RA where the repair line RL or RL' and the auxiliary repair line ARL are disposed may also be allocated to a transmission area TA. Therefore, according to the present disclosure, an area of the transmission area TA may be sufficiently ensured while ensuring a required area of the emission area EA regardless of the location of the repair lines RL and RL' and the auxiliary repair line ARL so that a transparent display device with a good quality may be provided.

The exemplary aspects of the present disclosure can also be described as follows:

According to an aspect of the present disclosure, there is provided a display device. The display device includes a first electrode of a first sub pixel of a first pixel, a first electrode of a second sub pixel of the first pixel, a first electrode of a first sub pixel of a second pixel, and a first electrode of a second sub pixel of the second pixel sequentially disposed along a first direction. The display device further includes a 1-1 welding electrode connected to the first electrode of the first sub pixel of the first pixel, a 1-2 welding electrode connected to the first electrode of the second sub pixel of the first pixel, a 2-1 welding electrode connected to the first electrode of the first sub pixel of the second pixel, and a 2-2 welding electrode connected to the first electrode of the second sub pixel of the second pixel. The display device further includes a first vertical repair line overlapping the 1-1 welding electrode and the 2-1 welding electrode and a second vertical repair line overlapping the 1-2 welding electrode and the 2-2 welding electrode. The first vertical repair line and the second vertical repair line include a transparent conductive material.

The first vertical repair line may be disposed on a different layer from the 1-1 welding electrode and the 2-1 welding electrode with at least one insulating layer therebetween and is connected to one of the 1-1 welding electrode and the 2-1 welding electrode through an open hole which passes through the at least one insulating layer.

The second vertical repair line may be disposed on a different layer from the 1-2 welding electrode and the 2-2 welding electrode with at least one insulating layer therebetween and is connected to one of the 1-2 welding electrode and the 2-2 welding electrode through an open hole which passes through the at least one insulating layer.

The first vertical repair line and the second vertical repair line may be disposed on the same layer.

The first sub pixel of the first pixel and the first sub pixel of the second pixel may emit light having a first color and the second sub pixel of the first pixel and the second sub pixel of the second pixel may emit light having a second color which is different from the first color.

The display device may further include a first electrode of a first sub pixel of a third pixel disposed to be adjacent to the first electrode of the second sub pixel of the second pixel along the first direction, a 2-1 auxiliary welding electrode connected to the first electrode of the first sub pixel of the second pixel, a 3-1 auxiliary welding electrode connected to the first electrode of the first sub pixel of the third pixel and an auxiliary repair line overlapping the 2-1 auxiliary welding electrode and the 3-1 auxiliary welding electrode. At least a part of the auxiliary repair line may include a transparent conductive material.

The 2-1 auxiliary welding electrode may be a part branched from the 2-1 welding electrode.

The auxiliary repair line may be disposed on a different layer from the 2-1 auxiliary welding electrode and the 3-1 auxiliary welding electrode with at least one insulating layer therebetween and is connected to one of the 2-1 auxiliary welding electrode and the 3-1 auxiliary welding electrode through an open hole which passes through the at least one insulating layer.

The first vertical repair line, the second vertical repair line and the auxiliary repair line may be disposed on the same layer.

The first sub pixel of the first pixel, the first sub pixel of the second pixel, the first sub pixel of the third pixel may emit light having a first color and the second sub pixel of the first pixel and the second sub pixel of the second pixel may emit light having a second color which is different from the first color.

The display device may further include a first electrode of a first sub pixel of a fifth pixel disposed to be adjacent to the first electrode of the first sub pixel of the first pixel in a second direction intersecting the first direction, a first electrode of a second sub pixel of the fifth pixel disposed to be adjacent to the first electrode of the first sub pixel of a fifth pixel along the first direction and adjacent to the first electrode of the second sub pixel of the first pixel along the second direction, a 5-1 welding electrode connected to the first electrode of the first sub pixel of a fifth pixel, a 5-2 welding electrode connected to the first electrode of the second sub pixel of the fifth pixel, a first horizontal repair line overlapping the 1-1 welding electrode and the 5-1 welding electrode and a second horizontal repair line overlapping the 1-2 welding electrode and the 5-2 welding electrode. At least a part of the first horizontal repair line and at least a part of the second horizontal repair line may include a transparent conductive material.

The first horizontal repair line may be disposed on a different layer from the 1-1 welding electrode and the 5-1 welding electrode with at least one insulating layer therebetween and is connected to one of the 1-1 welding electrode and the 5-1 welding electrode through an open hole which passes through the at least one insulating layer.

The second horizontal repair line may be disposed on a different layer from the 1-2 welding electrode and the 5-2 welding electrode with at least one insulating layer therebetween and is connected to one of the 1-2 welding electrode and the 5-2 welding electrode through an open hole which passes through the at least one insulating layer.

The first vertical repair line, the second vertical repair line, the first horizontal repair line and the second horizontal repair line may be disposed on the same layer.

The first sub pixel of the first pixel and the first sub pixel of the fifth pixel may emit light having a first color and the second sub pixel of the first pixel and the second sub pixel of the fifth pixel may emit light having a second color which is different from the first color.

The first vertical repair line may include overlapping units overlapping the 1-1 welding electrode and the 2-1 welding electrode and a connecting unit connecting the overlapping units and including the transparent conductive material. The overlapping units and the connecting unit may be connected to each other through a through hole which passes through an insulating layer interposed between the overlapping units and the connecting unit.

The through hole may not overlap a welding area.

The auxiliary repair line may include auxiliary overlapping units overlapping the 2-1 auxiliary welding electrode and the 3-1 auxiliary welding electrode and an auxiliary connecting unit connecting the auxiliary overlapping units and including the transparent conductive material. The auxiliary overlapping units and the auxiliary connecting unit may be connected to each other through a through hole which passes through an insulating layer interposed between the auxiliary overlapping units and the auxiliary connecting unit.

According to another aspect of the present disclosure, there is provided a display device. The display device includes a first pixel and a fifth pixel symmetrical to each other with respect to an imaginary axis extending in a first direction and disposed to be adjacent to each other in a second direction intersecting the first direction. The display device further includes a welding electrode and a repair line for repair between the first pixel and the fifth pixel. The first pixel includes a first electrode of a first sub pixel of the first pixel and a first electrode of a second sub pixel of the first pixel disposed to be adjacent to the first electrode of the first sub pixel of the first pixel in the first direction. The fifth pixel includes a first electrode of a first sub pixel of the fifth pixel disposed to be adjacent to the first electrode of the first sub pixel of the first pixel along the second direction and a first electrode of a second sub pixel of the fifth pixel disposed to be adjacent to the first electrode of the first sub pixel of the fifth pixel in the first direction and adjacent to the first electrode of the second sub pixel of the first pixel in the second direction. The welding electrode includes a 1-1 welding electrode connected to the first electrode of the first sub pixel of the first pixel, a 1-2 welding electrode connected to the first electrode of the second sub pixel of the first pixel, a 5-1 welding electrode connected to the first electrode of the first sub pixel of the fifth pixel, and a 5-2 welding electrode connected to the first electrode of the second sub pixel of the fifth pixel. The repair line includes a first horizontal repair line overlapping the 1-1 welding electrode and the 5-1 welding electrode and a second horizontal repair line overlapping the 1-2 welding electrode and the 5-2 welding electrode. At least a part of the first horizontal repair line and at least a part of the second horizontal repair line includes a transparent conductive material.

The first horizontal repair line may be disposed on a different layer from the 1-1 welding electrode and the 5-1 welding electrode with at least one insulating layer therebetween and is connected to any one of the 1-1 welding electrode and the 5-1 welding electrode through an open hole which passes through the at least one insulating layer.

The second horizontal repair line may be disposed on a different layer from the 1-2 welding electrode and the 5-2 welding electrode with at least one insulating layer therebetween and is connected to any one of the 1-2 welding electrode and the 5-2 welding electrode through an open hole which passes through the at least one insulating layer.

The display device may further include a second pixel disposed to be adjacent to the first pixel along the first direction. The second pixel may include a first electrode of a first sub pixel of the second pixel disposed to be adjacent to the first electrode of the second sub pixel of the first pixel along the first direction and a first electrode of a second sub pixel of the second pixel disposed to be adjacent to the first electrode of the first sub pixel of the second pixel along the first direction. The welding electrode may include a 2-1 welding electrode connected to the first electrode of the first sub pixel of the second pixel and a 2-2 welding electrode connected to the first electrode of the second sub pixel of the second pixel. The repair line may include a first vertical repair line overlapping the 1-1 welding electrode and the 2-1 welding electrode and a second vertical repair line overlapping the 1-2 welding electrode and the 2-2 welding electrode. At least a part of the first vertical repair line and the vertical second repair line may include a transparent conductive material.

The first vertical repair line may be disposed on a different layer from the 1-1 welding electrode and the 2-1 welding electrode with at least one insulating layer therebetween and is connected to one of the 1-1 welding electrode and the 2-1 welding electrode through an open hole which passes through the at least one insulating layer.

The second vertical repair line may be disposed on a different layer from the 1-2 welding electrode and the 2-2 welding electrode with at least one insulating layer therebetween and is connected to one of the 1-2 welding electrode and the 2-2 welding electrode through an open hole which passes through the at least one insulating layer.

The display device may further include a third pixel disposed to be adjacent to the second pixel along the first direction and an auxiliary welding electrode and an auxiliary repair line for repair between the second pixel and the third pixel. The third pixel may include a first electrode of a first sub pixel of the third pixel disposed to be adjacent to the first electrode of the second sub pixel of the second pixel along the first direction. The auxiliary welding electrode may include a 2-1 auxiliary welding electrode connected to the first electrode of the first sub pixel of the second pixel and a 3-1 auxiliary welding electrode connected to the first electrode of the first sub pixel of the third pixel. The auxiliary repair line may include an auxiliary repair line overlapping the 2-1 auxiliary welding electrode and the 3-1 auxiliary welding electrode. At least a part of the auxiliary repair line may include a transparent conductive material.

The auxiliary repair line may be disposed on a different layer from the 2-1 auxiliary welding electrode and the 3-1 auxiliary welding electrode with at least one insulating layer therebetween and is connected to one of the 2-1 auxiliary welding electrode and the 3-1 auxiliary welding electrode through an open hole which passes through the at least one insulating layer.

The first sub pixel of the first pixel, the first sub pixel of the fifth pixel, the first sub pixel of the second pixel, and the first sub pixel of the third pixel may emit light having the same color.

The first horizontal repair line may include overlapping units overlapping the 1-1 welding electrode and the 5-1 welding electrode and a connecting unit connecting the overlapping units and including the transparent conductive material. The overlapping units and the connecting unit may be connected to each other through a through hole which passes through an insulating layer interposed between the overlapping units and the connecting unit.

According to yet another aspect of the present disclosure, there is provided a display device. The display device includes a plurality of pixels each of which includes a plurality of sub pixels emitting lights of different colors, each sub pixel having a first electrode. The display device further includes a repair structure including a plurality of welding electrodes and a plurality of repair lines. The plurality of welding electrodes are respectively connected to the first electrodes of the plurality of sub pixels included in the plurality of pixels. The plurality of repair lines partially overlaps with the welding electrodes of the sub pixels emitting the same color in the adjacent pixels in a first direction and/or second direction intersecting the first direction. At least a part of the plurality of repair lines includes a transparent conductive material.

Through the above description, various modifications and changes may be performed by those skilled in the art without departing from the technical spirit of the present disclosure. Therefore, a technical field of the present disclosure is not limited to those described in the detailed description of the specification, but may be determined by the claims.

What is claimed is:

1. A display device, comprising:
   a first electrode of a first sub pixel of a first pixel, a first electrode of a second sub pixel of the first pixel, a first electrode of a first sub pixel of a second pixel, and a first electrode of a second sub pixel of the second pixel sequentially disposed along a first direction;
   a 1-1 welding electrode connected to the first electrode of the first sub pixel of the first pixel, a 1-2 welding electrode connected to the first electrode of the second sub pixel of the first pixel, a 2-1 welding electrode connected to the first electrode of the first sub pixel of the second pixel, and a 2-2 welding electrode connected to the first electrode of the second sub pixel of the second pixel; and
   a first vertical repair line overlapping the 1-1 welding electrode and the 2-1 welding electrode and a second vertical repair line overlapping the 1-2 welding electrode and the 2-2 welding electrode,
   wherein the first vertical repair line and the second vertical repair line include a transparent conductive material.

2. The display device according to claim 1, wherein the first vertical repair line is disposed on a different layer from the 1-1 welding electrode and the 2-1 welding electrode with at least one insulating layer therebetween and is connected to one of the 1-1 welding electrode and the 2-1 welding electrode through an open hole which passes through the at least one insulating layer,
   wherein the second vertical repair line is disposed on a different layer from the 1-2 welding electrode and the 2-2 welding electrode with at least one insulating layer therebetween and is connected to one of the 1-2 welding electrode and the 2-2 welding electrode through an open hole which passes through the at least one insulating layer, and
   wherein the first vertical repair line and the second vertical repair line are disposed on the same layer.

3. The display device according to claim 1, further comprising:
   a first electrode of a first sub pixel of a third pixel disposed to be adjacent to the first electrode of the second sub pixel of the second pixel along the first direction;
   a 2-1 auxiliary welding electrode connected to the first electrode of the first sub pixel of the second pixel;
   a 3-1 auxiliary welding electrode connected to the first electrode of the first sub pixel of the third pixel; and
   an auxiliary repair line overlapping the 2-1 auxiliary welding electrode and the 3-1 auxiliary welding electrode,
   wherein at least a part of the auxiliary repair line includes a transparent conductive material.

4. The display device according to claim 3, wherein the first sub pixel of the first pixel, the first sub pixel of the second pixel and the first sub pixel of the third pixel emit light having a first color, and the second sub pixel of the first pixel and the second sub pixel of the second pixel emit light having a second color which is different from the first color.

5. The display device according to claim 4, wherein the 2-1 auxiliary welding electrode is a part branched from the 2-1 welding electrode.

6. The display device according to claim 4, wherein the auxiliary repair line is disposed on a different layer from the 2-1 auxiliary welding electrode and the 3-1 auxiliary welding electrode with at least one insulating layer therebetween and is connected to one of the 2-1 auxiliary welding electrode and the 3-1 auxiliary welding electrode through an open hole which passes through the at least one insulating layer, and wherein the first vertical repair line, the second vertical repair line and the auxiliary repair line are disposed on the same layer.

7. The display device according to claim 3, wherein the auxiliary repair line includes:
   auxiliary overlapping units overlapping the 2-1 auxiliary welding electrode and the 3-1 auxiliary welding electrode; and
   an auxiliary connecting unit connecting the auxiliary overlapping units and including the transparent conductive material, and
   wherein the auxiliary overlapping units and the auxiliary connecting unit are connected to each other through a through hole which passes through an insulating layer interposed between the auxiliary overlapping units and the auxiliary connecting unit.

8. The display device according to claim 1, further comprising:
   a first electrode of a first sub pixel of a fifth pixel disposed to be adjacent to the first electrode of the first sub pixel of the first pixel in a second direction intersecting the first direction;
   a first electrode of a second sub pixel of the fifth pixel disposed to be adjacent to the first electrode of the first sub pixel of a fifth pixel along the first direction and adjacent to the first electrode of the second sub pixel of the first pixel along the second direction;
   a 5-1 welding electrode connected to the first electrode of the first sub pixel of a fifth pixel;
   a 5-2 welding electrode connected to the first electrode of the second sub pixel of the fifth pixel;
   a first horizontal repair line overlapping the 1-1 welding electrode and the 5-1 welding electrode; and
   a second horizontal repair line overlapping the 1-2 welding electrode and the 5-2 welding electrode,
   wherein at least a part of the first horizontal repair line and at least a part of the second horizontal repair line includes a transparent conductive material.

9. The display device according to claim 8, wherein the first horizontal repair line is disposed on a different layer from the 1-1 welding electrode and the 5-1 welding electrode with at least one insulating layer therebetween and is connected to one of the 1-1 welding electrode and the 5-1 welding electrode through an open hole which passes through the at least one insulating layer,
   wherein the second horizontal repair line is disposed on a different layer from the 1-2 welding electrode and the 5-2 welding electrode with at least one insulating layer therebetween and is connected to one of the 1-2 welding electrode and the 5-2 welding electrode through an open hole which passes through the at least one insulating layer, and
   wherein the first vertical repair line, the second vertical repair line, the first horizontal repair line and the second horizontal repair line are disposed on the same layer.

10. The display device according to claim 8, wherein the first sub pixel of the first pixel, the first sub pixel of the second pixel and the first sub pixel of the fifth pixel emit light having a first color, and the second sub pixel of the first pixel, the second sub pixel of the second pixel and the second sub pixel of the fifth pixel emit light having a second color which is different from the first color.

11. The display device according to claim 1, wherein the first vertical repair line includes:
    overlapping units overlapping the 1-1 welding electrode and the 2-1 welding electrode; and
    a connecting unit connecting the overlapping units and including the transparent conductive material, and
    wherein the overlapping units and the connecting unit are connected to each other through a through hole which passes through an insulating layer interposed between the overlapping units and the connecting unit.

12. The display device according to claim 11, wherein the through hole does not overlap a welding area.

13. A display device, comprising:
    a first pixel and a fifth pixel symmetrical to each other with respect to an imaginary axis extending in a first direction and disposed to be adjacent to each other in a second direction intersecting the first direction; and
    a welding electrode and a repair line for repair between the first pixel and the fifth pixel,
    wherein the first pixel includes:
    a first electrode of a first sub pixel of the first pixel and a first electrode of a second sub pixel of the first pixel disposed to be adjacent to the first electrode of the first sub pixel of the first pixel in the first direction,
    the fifth pixel includes:
    a first electrode of a first sub pixel of the fifth pixel disposed to be adjacent to the first electrode of the first sub pixel of the first pixel along the second direction and a first electrode of a second sub pixel of the fifth pixel disposed to be adjacent to the first electrode of the first sub pixel of the fifth pixel in the first direction and adjacent to the first electrode of the second sub pixel of the first pixel in the second direction,
    the welding electrode includes:
    a 1-1 welding electrode connected to the first electrode of the first sub pixel of the first pixel, a 1-2 welding electrode connected to the first electrode of the second sub pixel of the first pixel, a 5-1 welding electrode connected to the first electrode of the first sub pixel of the fifth pixel, and a 5-2 welding electrode connected to the first electrode of the second sub pixel of the fifth pixel;
    the repair line includes:
    a first horizontal repair line overlapping the 1-1 welding electrode and the 5-1 welding electrode and a second horizontal repair line overlapping the 1-2 welding electrode and the 5-2 welding electrode, and
    wherein at least a part of the first horizontal repair line and at least a part of the second horizontal repair line includes a transparent conductive material.

14. The display device according to claim 13, wherein the first horizontal repair line is disposed on a different layer from the 1-1 welding electrode and the 5-1 welding electrode with at least one insulating layer therebetween and is connected to any one of the 1-1 welding electrode and the 5-1 welding electrode through an open hole which passes through the at least one insulating layer, and
    wherein the second horizontal repair line is disposed on a different layer from the 1-2 welding electrode and the 5-2 welding electrode with at least one insulating layer therebetween and is connected to any one of the 1-2 welding electrode and the 5-2 welding electrode through an open hole which passes through the at least one insulating layer.

15. The display device according to claim 13, further comprising:
    a second pixel disposed to be adjacent to the first pixel along the first direction,
    wherein the second pixel includes:
    a first electrode of a first sub pixel of the second pixel disposed to be adjacent to the first electrode of the second sub pixel of the first pixel along the first direction and a first electrode of a second sub pixel of the second pixel disposed to be adjacent to the first electrode of the first sub pixel of the second pixel along the first direction, wherein the welding electrode includes:

a 2-1 welding electrode connected to the first electrode of the first sub pixel of the second pixel and a 2-2 welding electrode connected to the first electrode of the second sub pixel of the second pixel, wherein the repair line includes:

a first vertical repair line overlapping the 1-1 welding electrode and the 2-1 welding electrode and a second vertical repair line overlapping the 1-2 welding electrode and the 2-2 welding electrode, and wherein at least a part of the first vertical repair line and at least a part of the second vertical repair line includes a transparent conductive material.

16. The display device according to claim 15, wherein the first vertical repair line is disposed on a different layer from the 1-1 welding electrode and the 2-1 welding electrode with at least one insulating layer therebetween and is connected to one of the 1-1 welding electrode and the 2-1 welding electrode through an open hole which passes through the at least one insulating layer, and wherein the second vertical repair line is disposed on a different layer from the 1-2 welding electrode and the 2-2 welding electrode with at least one insulating layer therebetween and is connected to one of the 1-2 welding electrode and the 2-2 welding electrode through an open hole which passes through the at least one insulating layer.

17. The display device according to claim 15, further comprising:

a third pixel disposed to be adjacent to the second pixel along the first direction; and an auxiliary welding electrode and an auxiliary repair line for repair between the second pixel and the third pixel, wherein the third pixel includes:

a first electrode of a first sub pixel of the third pixel disposed to be adjacent to the first electrode of the second sub pixel of the second pixel along the first direction;

wherein the auxiliary welding electrode includes:

a 2-1 auxiliary welding electrode connected to the first electrode of the first sub pixel of the second pixel and a 3-1 auxiliary welding electrode connected to the first electrode of the first sub pixel of the third pixel, wherein the auxiliary repair line includes:

an auxiliary repair line overlapping the 2-1 auxiliary welding electrode and the 3-1 auxiliary welding electrode, and wherein at least a part of the auxiliary repair line includes a transparent conductive material.

18. The display device according to claim 17, wherein the auxiliary repair line is disposed on a different layer from the 2-1 auxiliary welding electrode and the 3-1 auxiliary welding electrode with at least one insulating layer therebetween and is connected to one of the 2-1 auxiliary welding electrode and the 3-1 auxiliary welding electrode through an open hole which passes through the at least one insulating layer.

19. The display device according to claim 13, wherein the first horizontal repair line includes:

overlapping units overlapping the 1-1 welding electrode and the 5-1 welding electrode; and a connecting unit connecting the overlapping units and including the transparent conductive material, and wherein the overlapping units and the connecting unit are connected to each other through a through hole which passes through an insulating layer interposed between the overlapping units and the connecting unit.

20. A display device, comprising:

a plurality of pixels each of which includes a plurality of sub pixels emitting lights of different colors, each sub pixel having a first electrode; and a repair structure including a plurality of welding electrodes and a plurality of repair lines, wherein the plurality of welding electrodes are respectively connected to the first electrodes of the plurality of sub pixels included in the plurality of pixels, wherein the plurality of repair lines partially overlaps with the welding electrodes of the sub pixels emitting the same color in the adjacent pixels in a first direction and/or second direction intersecting the first direction, and wherein at least a part of the plurality of repair lines includes a transparent conductive material.

* * * * *